(12) United States Patent
Sameshima et al.

(10) Patent No.: US 8,705,908 B2
(45) Date of Patent: Apr. 22, 2014

(54) OPTICAL TRANSMISSION MODULE, METHOD FOR MANUFACTURING OPTICAL TRANSMISSION MODULE, AND ELECTRONIC DEVICE

(75) Inventors: Hiroshi Sameshima, Nara (JP); Naru Yasuda, Uji (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 609 days.

(21) Appl. No.: 13/055,965

(22) PCT Filed: Sep. 14, 2009

(86) PCT No.: PCT/JP2009/004565
§ 371 (c)(1), (2), (4) Date: Jan. 26, 2011

(87) PCT Pub. No.: WO2010/035420
PCT Pub. Date: Apr. 1, 2010

(65) Prior Publication Data
US 2011/0123147 A1 May 26, 2011

(30) Foreign Application Priority Data
Sep. 24, 2008 (JP) ................................. 2008-244162

(51) Int. Cl.
*G02B 6/12* (2006.01)
*G02B 6/43* (2006.01)
*G02B 6/42* (2006.01)

(52) U.S. Cl.
CPC ............... *G02B 6/43* (2013.01); *G02B 6/4214* (2013.01); *G02B 6/42* (2013.01)
USPC .................... 385/14; 385/32; 385/88; 385/92

(58) Field of Classification Search
CPC .......... G02B 6/43; G02B 6/42; G02B 6/4214
USPC ..................................................... 385/14, 89
See application file for complete search history.

(56) References Cited

U.S. PATENT DOCUMENTS

| 6,885,099 B2 | 4/2005 | Ogawa |
| 2005/0058408 A1* | 3/2005 | Colgan et al. .................. 385/89 |

(Continued)

FOREIGN PATENT DOCUMENTS

| JP | 2002-56737 A | 2/2002 |
| JP | 2004-146603 A | 5/2004 |

(Continued)

OTHER PUBLICATIONS

International Search Report w/translation from PCT/JP2009/004565 dated Dec. 8, 2009 (6 pages).

*Primary Examiner* — Hemang Sanghavi
(74) *Attorney, Agent, or Firm* — Osha Liang LLP

(57) ABSTRACT

An optical transmission module has an optical wiring for transmitting light, and an optical element for irradiating a light incidence plane of the optical wiring with light and a control circuit component for driving light emission of the optical element based on an externally input electric signal, or an optical element for receiving light emitted from a light emitting surface of the optical wiring and converting to an electric signal and a control circuit component for amplifying the electric signal output from the optical element and outputting to the outside. A plurality of boards overlapped and stacked so as to form a step with each other is arranged. A first board stacked at one end in a stacking direction of the plurality of boards is mounted with the optical wiring and the optical element so as to sandwich both surfaces in the stacking direction, and a board surface on the first board side of a second board stacked at another end is mounted with the control circuit component.

18 Claims, 20 Drawing Sheets

(56) References Cited

U.S. PATENT DOCUMENTS

| | | | |
|---|---|---|---|
| 2005/0100264 A1* | 5/2005 | Kim et al. | 385/14 |
| 2006/0050493 A1* | 3/2006 | Hamasaki et al. | 361/767 |
| 2007/0104412 A1* | 5/2007 | Hsu | 385/14 |
| 2007/0297713 A1* | 12/2007 | Lu et al. | 385/14 |
| 2009/0285524 A1* | 11/2009 | Ishii et al. | 385/14 |

FOREIGN PATENT DOCUMENTS

| | | |
|---|---|---|
| JP | 2004-240220 A | 8/2004 |
| JP | 2004-246279 A | 9/2004 |
| JP | 2004-258065 A | 9/2004 |
| JP | 2004-258066 A | 9/2004 |
| JP | 2004-264382 A | 9/2004 |
| JP | 2005-3944 A | 1/2005 |
| JP | 2006-30798 A | 2/2006 |
| JP | 2006-73653 A | 3/2006 |
| JP | 2006-156570 A | 6/2006 |
| JP | 2008-65287 A | 3/2008 |
| JP | 2008-158000 A | 7/2008 |
| JP | 2008-209514 A | 9/2008 |

* cited by examiner

OPTICAL TRANSMISSION MODULE, METHOD FOR MANUFACTURING OPTICAL TRANSMISSION MODULE, AND ELECTRONIC DEVICE

BACKGROUND OF THE INVENTION

1. Technical Field

The present invention relates to an optical transmission module for transmitting optical signals, a method for manufacturing the optical transmission module, and an electronic device.

2. Background Art

An optical communication network enabling large capacity data communication at high speed is expanding in recent years. Such optical communication network is assumed to be mounted on commercial-off-the-shelf apparatuses in the future. An optical data transmission cable (optical cable) for electric input/output that can be used no different from the current electric cable is being desired for the application of higher speed and larger capacity of data transfer, noise countermeasures, and data transmission between the boards in the device. In the view of flexibility, a film optical waveguide is desirably used for the optical cable.

The optical waveguide is formed by a core having a large index of refraction and a clad being arranged contacting the periphery of the core and having a small index of refraction, where the optical signal entered to the core is propagated while repeating total reflecting at the boundary of the core and the clad. The film optical waveguide has flexibility as the core and the clad are made from soft polymer material.

The optical transmission module mounted with the film optical waveguide having flexibility is disclosed in patent document 1. The optical transmission module disclosed in patent document 1 has a configuration in which an optical chip including an optical element that optically couples with the light transmitted through the optical waveguide and an electrical chip for electrically controlling the optical chip are embedded in a board.

Patent document 2 discloses a flexible print wiring substrate "including a connector attachment portion in which a connector portion is attached on a front surface side, and a reinforcement portion, integrally formed with the connector attachment portion, for reinforcing the connector attachment potion by being folded towards the back surface side of the connector attachment portion".

Patent Document 1: Japanese Patent Specification No. 3882738 (registered Nov. 24, 2006)

Patent Document 2: Japanese Unexamined Patent Publication No. 2006-156570 (publicized Jun. 15, 2006)

SUMMARY

In recent years, a so-called thinning of reducing the total height of the entire module is desired in the optical transmission module including the optical waveguide.

In the optical transmission module disclosed in patent document 1, the optical chip and the electrical chip are embedded in the board and, therefore, the thickness of the board depends on the height of the components configuring the optical chip and the electronic chip, and hence the thinning of the entire module becomes difficult.

In the configuration applied with patent document 2, a structure in which the mounted portion is reinforced is realized by folding the portion where the optical chip and the electrical chip are mounted in the board towards the back surface side. The thickness of the folded portion thus mounts up, and the thinning of the optical transmission module becomes difficult.

An attempt is made to reduce the interval between the optical waveguide and the optical element that optical couples with the optical waveguide to a minimum to thin the optical transmission module. When the interval between the optical waveguide and the optical element is reduced to a minimum, an optical transmission module shown in FIG. 25 is considered.

As shown in the figure, a control circuit component 113 including an optical waveguide 110, a light emitting element 111, and a light emission drive IC for driving the light emission of the light emitting element 111 is mounted on one electric circuit board 109 in the optical transmission module 100. The optical waveguide 110 and the light emitting element 111 are mounted so as to sandwich both surfaces of the electric circuit board 109. The control circuit component 113 is mounted on the surface of the electric circuit board 109 mounted with the light emitting element 111. That is, the light emitting element 111 and the control circuit component 113 are arranged on the same surface.

When further thinning the optical transmission module 100 shown in FIG. 25, the heights of the components such as the electric circuit board 109, the light emitting element 111, and the control circuit component 113 may be minimized (thinned). However, there is a limit to minimizing the height of each component.

Generally, a so-called flexible board or a board having flexibility is used for the electric circuit board 109 to thin to a minimum. The flexible board is made from a base material that becomes an insulating body, a copper foil, a cover coating, and the like. The limit to minimizing the thickness for each material of the flexible board is 12.5 μm for the base material and the cover coating, and 8 μm for the copper foul.

The light emitting element 111 and the control circuit component 113 are generally cut out from a wafer and manufactured as a chip. Thus, the thicknesses of such components tend to increase with increase in area. The limit is the area of the light emitting element 111 is about 0.2□, the area of the light emission drive IC or one of the control circuit component 113 is about 1.0□, and the area of a resistor or one of the control circuit component 113 is about 0.2×0.4. Thus, when mounted on the electric circuit board 109, the height differs for each component of the control circuit component 113 and the light emitting module 111, and the height of the light emission drive IC becomes the highest. The module as a whole then will have a configuration in which the light emission drive IC is projected out. Therefore, it is difficult to make thinner than the height of the light emission drive IC on the light emitting element 111 side of the optical transmission module 100.

Therefore, even if the heights of the components such as the electric circuit board 109, the light emitting element 111, and the control circuit component 113 are minimized, the optical waveguide 110 and the light emission drive IC are projected out in the optical transmission module 101 as a whole. Therefore, when the optical transmission module 100 shown in FIG. 25 is further thinned, the limit of the total height H' becomes the total of the height $H_2'$ of the light emission drive IC, the height $H_4'$ of the optical waveguide 110, and the thickness D' of the electric circuit board 109, and it is difficult to be thinned smaller than such total.

When the height of each component of the optical transmission module 100 is minimized, the strength of the module itself becomes weak, and a need to separately arrange a reinforcement portion arises.

One or more embodiments of the present invention provides an optical transmission module capable of ensuring the module strength and enabling thinning in the module as a whole, a method for manufacturing the optical transmission module, and an electronic device.

In accordance with one aspect of the present invention, there is provided an optical transmission module including: an optical wiring for transmitting light; and an optical element for irradiating a light incidence plane of the optical wiring with light and a control circuit component for driving light emission of the optical element based on an externally input electric signal; or an optical element for receiving light emitted from a light emitting surface of the optical wiring and converting to an electric signal and a control circuit component for amplifying the electric signal output from the optical element and outputting to the outside; wherein a plurality of boards overlapped and stacked so as to form a step with each other is arranged; and a first board stacked at one end in a stacking direction of the plurality of boards is mounted with the optical wiring and the optical element so as to sandwich both surfaces in the stacking direction, and a board surface on the first board side of a second board stacked at another end is mounted with the control circuit component.

According to the above configuration, the projection amount of the control circuit component can be reduced in the optical transmission module as a whole since the control circuit component is mounted on the step portion formed by a plurality of boards. As a result, the entire optical transmission module can be thinned.

The strength of the entire module can be ensured by the stacked portion since the configuration in which the plurality of board s are stacked is adopted.

According to one or more embodiments of the present invention, the plurality of boards include the first board and the second board; and the control circuit component is mounted on a board surface on which the first board is stacked in the second board.

In the case of such configuration, the step portion formed by the first board and the second board is formed by the surface on which the optical element is mounted, the end face of the first board 9 and the board surface. The step portion creates the step corresponding to the thickness of the first board between the board surface, on which the control circuit component is arranged, and the surface, on which the optical element is mounted. That is, the projection amount of the control circuit component in the entire optical transmission module is a value obtained by subtracting the thickness of the first board and the height of the optical element from the height of the control circuit component. Therefore, in the above configuration, the projection amount of the control circuit component in the entire module can be reduced by effectively using the step.

As a result, according to the above-described configuration, the total height H becomes smaller than the sum of the height of the control circuit component, the height of the optical wiring, and the thickness of the first board. Therefore, the entire module can be thinned.

According to one or more embodiments of the present invention, the plurality of boards includes the first board, the second board, and a third arranged between the first board and the second board; and the third is arranged to avoid the control circuit component.

According to one or more embodiments of the present invention, a step portion including an end face in a light transmitting direction of the first board of the step portions formed by the plurality of boards is arranged with a light emission drive IC for driving the light emission of the optical element or an amplification IC for amplifying the electric signal output from the optical element of the plurality of control circuit components.

According to the above-described configuration, the light emission drive IC or the amplification IC is arranged on the step portion including the end face in the light transmitting direction of the first board, and hence the optical element mounted on the first board and the light emission drive IC or the amplification IC can be arranged close to each other.

Furthermore, when mounting the light emission drive IC or the amplification IC on the second board using an adhesive, the adhesive is stopped at the step portion. As a result, the adhesive for the light emission drive IC or the amplification IC does not interfere with the optical element mounting region. Thus, the under fill shape that is formed when mounting the optical element on the first board using the adhesive can be strictly controlled by the application amount of the adhesive. An effect that the optical characteristics of the optical enhance thus can be obtained.

According to one or more embodiments of the present invention, a recess recessed towards an inner side of the board is formed at one of four sides at a periphery of each board; and the plurality of boards are stacked so that two surfaces of the recess facing each other of each board sandwich the optical element, the optical wiring, or the control circuit component.

Thus, the step portion including two opposing surfaces in the recess is formed to sandwich the optical wiring, the optical element, or the control circuit component. Thus, the strength of the entire module further enhances.

When forming a half cut line in the board and removing the unnecessary portion along the half cut line, the board formed with the recess can be manufactured by stripping only in the direction towards the inner side of the board. That is, the manufacturing of the optical transmission module is easy and convenience since the stripping direction is just one direction.

According to one or more embodiments of the present invention, an opening passing through in the stacking direction is formed in the first board; and side surfaces forming the opening surround the control circuit component.

According to such configuration, the entire periphery of the control circuit component is surrounded by the step portion including the side surfaces forming the opening. Thus, when sealing the control circuit component using a sealant, such sealant is prevented from leaking outside.

According to one or more embodiments of the present invention, an electrical wiring is formed on both surfaces of the first board, and an inter-layer wiring for connecting the electrical wirings formed on both surfaces is formed on the first board.

The electrical connection between the optical element and the control circuit component thus becomes possible.

According to one or more embodiments of the present invention, the first board and the optical wiring are integrated.

The first board and the optical wiring are thereby fixed. Thus, the strength of the first board mounting portion of the optical wiring enhances. As a result, the mechanical stress from the outside such as tension of the optical transmission module enhances.

According to one or more embodiments of the present invention, the control circuit components are arranged side by side perpendicular to the light transmitting direction of the optical wiring on the board.

According to such configuration, a case in which the connector falls out from the optical transmission module when a force is applied in the width direction of the optical transmission module when the optical transmission module is applied to the Snap-on connector is prevented.

The material of the board is not limited to glass epoxy, polyimide and the like used in the conventional electric circuit board. Plastic material, metal material, and the like may be used.

According to one or more embodiments of the present invention, the optical wiring is formed with an optical path conversion mirror surface for converting an optical path of light transmitted to the end; and a lid member is arranged to cover the optical path conversion mirror surface.

Thus, the thinning can be realized while protecting the optical path conversion mirror surface and enhancing the board strength. The board may be a lid member.

According to one or more embodiments of the present invention, the control circuit component is arranged in plurals, and at least one board is arranged between the first board and the second board; and a height in the stacking direction of a board arranged between the first board and the second board and the first board is the same as or less than a height of a maximum height control circuit component having the highest height in the stacking direction out of the plurality of control circuit components.

If the height in the stacking direction of the board arranged between the first board and the second board and the first board is higher than the height of the maximum height control circuit component, the height of the entire module becomes higher than the height of the maximum height control circuit component, and the merits of thinning the module are not as great.

According to the above-described configuration, on the other hand, the height in the stacking direction of the board arranged between the first board and the second board and the first board is the same as or smaller than the height of the maximum control circuit component having the highest height in the stacking direction out of the plurality of control circuit components, and hence, the periphery of the control circuit including the maximum height control circuit component is completely surrounded or surrounded with one of the four sides opened to a horseshoe shape, and the merits of thinning the module become greater.

According to one or more embodiments of the present invention, the maximum height control circuit component is mounted on the board surface of the second board; and the first board is a protective board for protecting a surface on a side opposite to the second board in the maximum height control circuit component.

Thus, water droplets and dust are prevented from attaching the surface on the side opposite to the second board in the maximum height control circuit component.

According to one or more embodiments of the present invention, the optical transmission module further includes: an external connector for electrically connecting with an external wiring; wherein the external connector is formed with a connector recess recessed in the light transmitting direction; and a first fit-in portion to be fitted to the connector recess is formed at an end in the light transmitting direction of the optical transmission module.

According to one or more embodiments of the present invention, the optical transmission module further includes: an external connector for electrically connecting with an external wiring; wherein the external connector is formed with a vertical connector recess recessed perpendicular to the light transmitting direction; and a second fit-in portion to be fitted to the vertical connector recess is formed at an end in the light transmitting direction of the optical transmission module.

In accordance with another aspect of the present invention, there is provided an electronic device including the above optical transmission module.

Thus, an electronic device that ensures the module strength and that can be thinned for the module as a whole can be provided.

In accordance with still another aspect of the present invention, there is provided a method for manufacturing an optical transmission module including, an optical wiring for transmitting light; and an optical element for irradiating a light incidence plane of the optical wiring with light and a control circuit component for driving light emission of the optical element based on an externally input electric signal; or an optical element for receiving light emitted from a light emitting surface of the optical wiring and converting to an electric signal and a control circuit component for amplifying the electric signal output from the optical element and outputting to the outside; the method including the steps of: overlapping and stacking a plurality of boards so as to form a step with each other; and mounting the optical wiring and the optical element on a first board stacked at one end in a stacking direction of the plurality of boards so as to sandwich both surfaces in the stacking direction, and mounting the plurality of control circuit components on a board surface on the first board side of a second board stacked at another end.

Thus, a manufacturing method for the optical transmission module that ensures the module strength and that can be thinned for the module as a whole can be provided.

Therefore, the optical transmission module according to one or more embodiments of the present invention includes a plurality of boards overlapped and stacked to form a step with each other, a first board stacked at one end in a stacking direction out of the plurality of boards being mounted with the optical wiring and the optical element so as to sandwich both surfaces in the stacking direction, and a board surface on the first board side in a second board stacked at the other end being mounted with the control circuit component.

The electronic device according to one or more embodiments of the present invention includes the optical transmission module described above.

The manufacturing method of the optical transmission module according to one or more embodiments of the present invention includes a stacking step of overlapping and stacking a plurality of boards to form a step with each other, and a mounting step of mounting the optical wiring and the optical element on a first board stacked at one end in a stacking direction out of the plurality of boards so as to sandwich both surfaces in the stacking direction, and mounting a plurality of control circuit components on a board surface on the first board side in a second board stacked at the other end.

Thus, the module strength can be ensured and the entire module can be thinned.

BRIEF DESCRIPTION OF THE DRAWINGS

FIG. 8(a) shows the optical transmission module of the first stacked example, and FIG. 8(b) shows the optical transmission module of the second stacked example 2.

FIG. 10(a) shows the optical transmission module of the first stacked example and FIG. 10(b) shows the optical transmission module of the second stacked example.

FIG. 11(a) shows the optical transmission module of the first stacked example and FIG. 11(b) shows the optical transmission module of the second stacked example.

FIGS. 12(a) and 12(b) show the optical transmission module of the first stacked example and FIGS. 12(c) and 12(d) show the optical transmission module of the second stacked example.

FIG. 14(a) shows the optical transmission module of the first stacked example and FIG. 14(b) shows the optical transmission module of the second stacked example.

FIG. 15(a) shows the optical transmission module of the first stacked example and FIG. 15(b) shows the optical transmission module of the second stacked example.

FIG. 16(a) shows the optical transmission module of the first stacked example and FIG. 16(b) shows the optical transmission module of the second stacked example.

FIG. 19(a) shows the optical transmission module of the first stacked example and FIG. 19(b) shows the optical transmission module 1 of the second stacked example

DETAILED DESCRIPTION

Embodiments of the present invention will be hereinafter described based on the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(Schematic Configuration of Optical Transmission Module)

Figure 2:
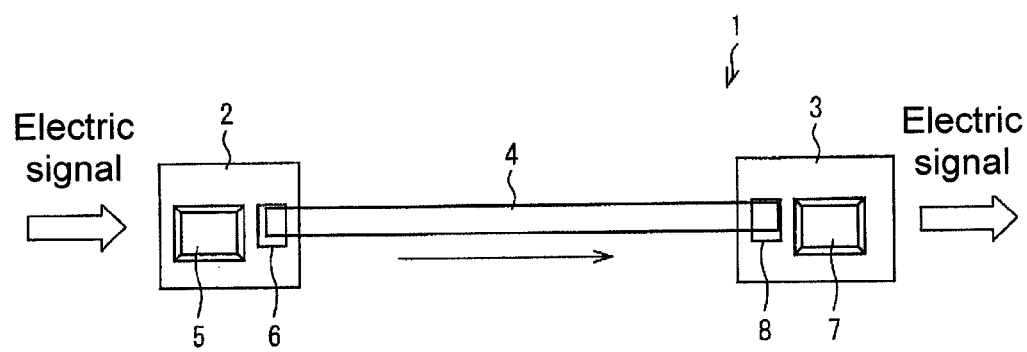
FIG. 2 is a schematic view showing a schematic configuration of the optical transmission module according to one embodiment of the present invention.

FIG. 2 shows a schematic configuration of an optical transmission module 1 according to the present embodiment. As shown in the figure, the optical transmission module 1 includes a light transmission processing section 2, a light reception processing section 3, and an optical wiring 4.

The light transmission processing section 2 is configured to include a light emission drive unit (control circuit component) 5 and a light emitting unit (optical element) 6. The light emission drive unit 5 drives the light emission of the light emitting unit 6 based on an externally input electric signal. The light emission drive unit 5 is configured by an IC (Integrated Circuit) for light emission drive, a resistor, and the like. Although not illustrated, the light emission drive unit 5 includes an electrical connecting portion with an electrical wiring for transmitting an electric signal from the outside.

The light emitting unit 6 emits light based on the drive control by the light emission drive unit 5. The light emitting unit 6 is configured by a light emitting element such as a VCSEL (Vertical Cavity-Surface Emitting Laser). A light incident side end of the optical wiring 4 is irradiated with the light emitted from the light emitting unit 6 as an optical signal.

The light reception processing section 3 is configured to include an amplifier unit (control circuit component) 7 and a light receiving unit (optical element) 8. The light receiving unit 8 receives light serving as an optical signal emitted from a light emitting side end of the optical wiring 4, and outputs an electric signal obtained through photoelectric conversion. The light receiving unit 8 is configured by a light receiving element such as a PD (Photo-Diode).

The amplifier unit 7 amplifies the electric signal output from the light receiving unit 8, and outputs the resultant signal to the outside. The amplifier unit 7 is configured by an IC for amplification, a resistor, and the like. Although not shown, the amplifier unit 7 includes an electrical connecting portion with the electrical wiring for transmitting the electric signal to the outside.

The optical wiring 4 is a medium for transmitting the light emitted from the light emitting unit 6 to the light receiving unit 8. The details on the configuration of the optical wiring 4 will be hereinafter described.

Figure 3:
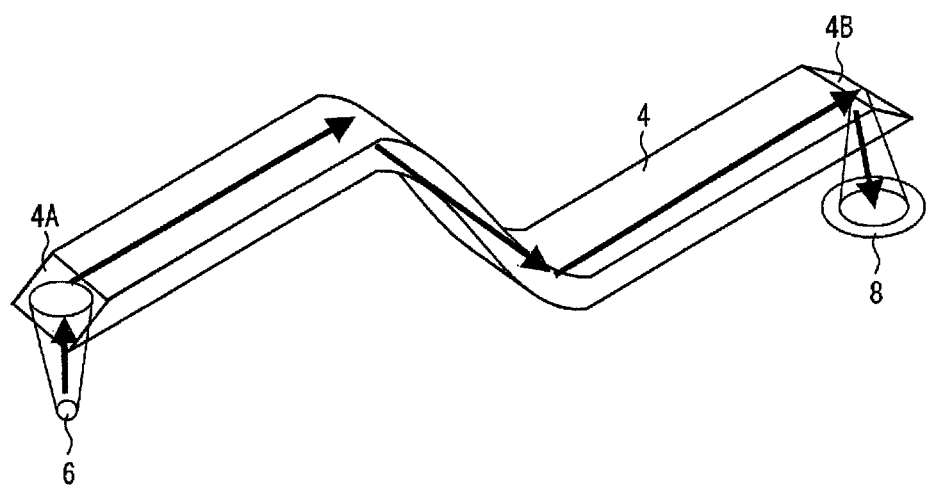
FIG. 3 is a perspective view schematically showing a state of optical transmission in an optical wiring.

FIG. 3 schematically shows the state of optical transmission in the optical wiring 4. As shown in the figure, the optical wiring 4 is made from a columnar member having flexibility. A light incidence plane 4A is arranged at the light incident side end of the optical wiring 4, and a light emission plane 4B is arranged at the light emitting side end.

The light emitted from the light emitting unit 6 enters the light incident side end of the optical wiring 4 from a direction perpendicular to the light transmitting direction of the optical wiring 4. The incident light is reflected at the light incidence plane 4A, and advances through the optical wiring 4. The light that advanced through the optical wiring 4 and reached the light emitting side end is reflected at the light emission plane 4B, and emitted in the direction perpendicular to the light transmitting direction of the optical wiring 4. The light receiving unit 8 is irradiated with the emitted light, and photoelectric conversion is carried out in the light receiving unit 8.

According to such configuration, the light emitting unit 6 serving as a light source can be arranged in the lateral direction with respect to the light transmitting direction in the optical wiring 4. Thus, when the optical wiring 4 needs to be arranged parallel to the board surface, the light emitting unit 6 may be installed between the optical wiring 4 and the board surface so as to emit the light in the normal direction of the board surface. Such configuration is easier to mount than the configuration in which the light emitting unit 6 is installed so as to emit the light parallel to the board surface, and can be more miniaturized in terms of configuration. This is because the size in the direction perpendicular to the direction of emitting light is greater than the size in the direction of emitting light in the general configuration of the light emitting unit 6. Furthermore, application can be made even to the configuration that uses a light emitting element for plane mounting in which an electrode and the light emitting unit are in the same plane.

(Configuration of Optical Wiring 4)

Figure 1:
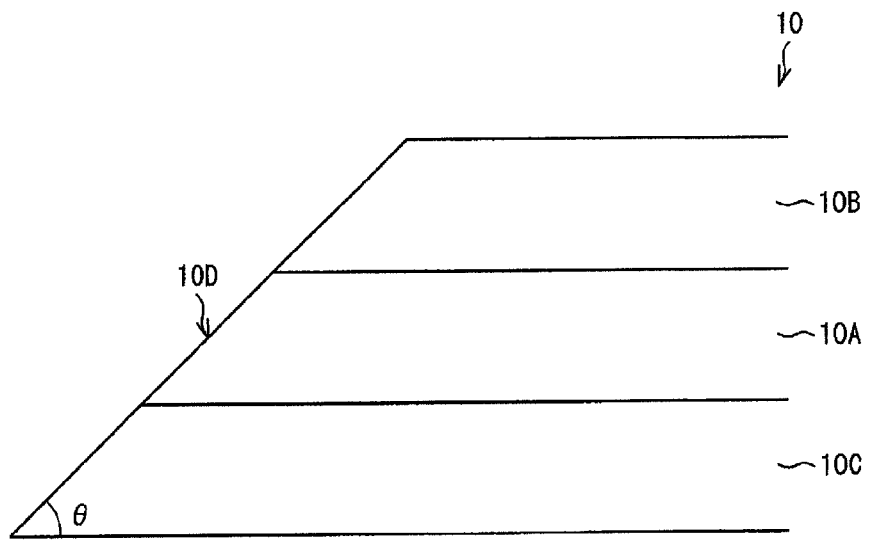
FIG. 1 is a cross-sectional view of an optical waveguide that can be applied to an optical transmission module according to one embodiment of the present invention.

The optical wiring 4 is not particularly limited as long as it is a wiring capable of interiorly transmitting light. The optical wiring 4 according to one or more embodiments of the present invention is a optical waveguide. FIG. 1 shows a cross-sectional view of an optical waveguide 10 that can be applied to the optical transmission module 1. As shown in the figure, the optical waveguide 10 is configured by a core 10A, an upper clad layer 10B, and a lower clad layer 10C. In other words, the optical waveguide 10 has a stacked structure in which the core 10A is sandwiched by the upper clad layer 10B and the lower clad layer 10C. The optical signal transmitted by the optical waveguide 10 advances through the core 10A while being reflected at the interface of the core 10A and the upper clad layer 10B and the interface of the core 10A and the lower clad layer 10C. In FIG. 1, the longitudinal direction (optical axis direction) of the optical waveguide 10 in the vicinity of the end of the optical waveguide 10 is the X-axis direction, and the stacked direction of the core 10A, the upper clad layer 10B and the lower clad layer 10C is the Y-axis direction.

The end face of the optical waveguide 10 is not perpendicular with respect to the optical axis (X-axis), and is cut diagonally to form an optical path converting mirror surface 10D. Specifically, the end face of the optical waveguide 10 is perpendicular with respect to the XY plane and is inclined to form an angle $\theta$ ($\theta<90°$) with respect to the X-axis.

Thus, the signal light transmitting through the core 10A is reflected at the optical path converting mirror surface 10D thereby changing the advancing direction, and emitted from the optical path converting mirror surface 10D towards the light emitting unit 8 at the light emitting side of the optical waveguide 10. The light emission plane (or incident surface) of the optical waveguide 10 exists at the outer surface of the lower clad layer 4C (may be upper clad layer 4B) due to the arrangement of the optical path converting mirror surface 4D, and the light receiving surface of the light receiving unit 8 (or light emitting surface of light emitting unit 6) is arranged to face the light emission plane (or incident surface) of the optical waveguide 10.

The inclination angle $\theta$ of the optical path converting mirror surface 10D is normally set to 45° to facilitate the position alignment of the optical path converting mirror surface 10D and the light receiving surface of the light receiving unit 8 (or light emitting surface of light emitting unit 6). The optical path converting mirror may be formed by externally attaching a mirror to the end of the optical waveguide 10.

In the optical transmission module 1, a protective film may be further arranged on the upper clad layer 10B or the lower clad layer 10C to protect the optical waveguide 10.

(Configuration of Light Transmission Processing Section 2 or Light Reception Processing Section 3)

The configuration of the light transmission processing section 2 or the light reception processing section 3, which is the characteristics of the optical transmission module 1, will now be described below. In the following, the light emitting unit 6 for emitting light with respect to the light incidence plane 4A of the optical wiring 4 or the light receiving unit 8 for receiving the light emitted from the light emission plane 4B of the optical wiring 4 and converting the light to an electric signal is collectively referred to as an optical element to simplify the description. The components configuring the light emission drive unit 5 for driving the light emission of the light emitting unit 6 based on the externally input electric signal, or the amplifier unit 7 for amplifying the electric signal output from the light receiving unit 8 and outputting the same to the outside are collectively referred to as control circuit components.

Figure 4:
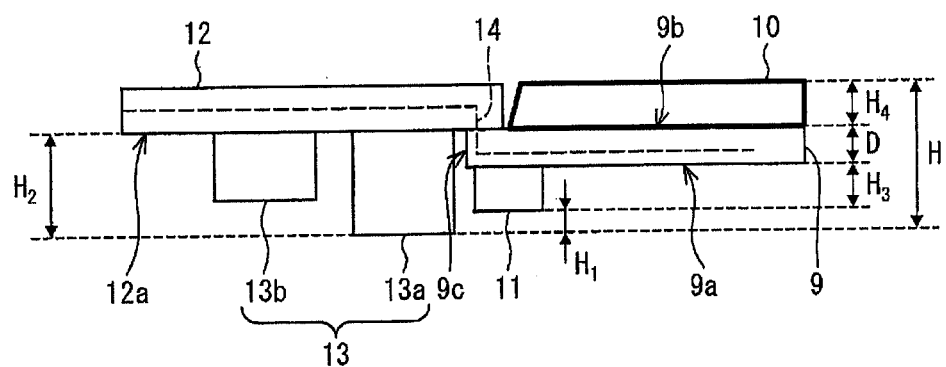
FIG. 4 is a cross-sectional view showing a schematic configuration of a light transmission processing section or a light reception processing section in the optical transmission module of FIG. 2.

FIG. 4 is a cross-sectional view showing a schematic configuration of the light transmission processing section 2 or the light reception processing section 3 in the optical transmission module 1.

As shown in the figure, the optical transmission module 1 includes a first electric circuit board (first board) 9, the optical waveguide 10, an optical element 11, a second electric circuit board (second board) 12, and a control circuit component 13. The first electric circuit board 9 and the second electric circuit board 12 are stacked so as to form a step with respect to each other. In FIG. 4, the longitudinal direction (optical axis direction) of the optical waveguide 10 is the X-axis direction, and the stacking direction of the core 10A, the upper clad layer 10B, and the lower clad layer 10C is the Y-axis direction, similar to FIG. 1. The Y-axis direction also coincides with the stacking direction of the first electric circuit board 9 and the second electric circuit board 12. The direction perpendicular to the X-axis direction and the Y-axis direction is the Z-axis direction. In the following description, the surface on the side of the first electric circuit board 9 or the second electric circuit board 12 is referred to as the "lower surface" and the surface on the side opposite to the lower surface is referred to as the "upper surface" in each member of the optical waveguide 10, the optical element 11, and the control circuit component 13.

In the optical transmission module 1, the strength of the entire module is ensured and the total height (height in the stacking direction) of the entire module is reduced by effectively using the step portion 14 formed by stacking the first electric circuit board 9 and the second electric circuit board 12.

As shown in FIG. 4, the optical element 11 is mounted on a surface 9a of the first electric circuit board 9. Furthermore, the optical waveguide 10 is mounted on a surface 9b opposite to the surface 9a mounted with the optical element 11 in the first electric circuit board 9. That is, in the optical transmission module 1, the optical waveguide 10 and the optical element 11 are mounted so as to sandwich both surfaces 9a, 9b in the Y-axis direction of the first electric circuit board 9. The first electric circuit board 9 is formed with an optical path hole 15 for ensuring the optical path of the light advancing between the optical waveguide 10 and the optical element 11. The control circuit component 13 is mounted on a board surface 12a, on which the first electric circuit board 9 is stacked, in the second electric circuit board 12. In FIG. 4, an IC 13a (light emission drive IC or amplification IC) and a resistor 13b are shown as representative control circuit components 13.

According to the configuration shown in FIG. 4, the step portion 14 is formed by the surface 9a, on which the optical element 11 is mounted, an end face 9c in the X-axis direction of the first electric circuit board 9, and the board surface 12a. A step of the thickness D in the Y-axis direction of the first electric circuit board 9 thus creates between the board surface 12a mounted with the control circuit component 13 and the surface 9a mounted with the optical element 11 by the step portion 14. As a result, the projection amount $H_1$ in the Y-axis direction of the control circuit component 13 in the optical transmission module 1 as a whole is a value obtained by subtracting the thickness D of the first electric circuit board 9 and the height $H_3$ of the optical element 11 from the height $H_2$ of the control circuit component 13. In the conventional configuration shown in FIG. 25, the light emitting element 111 and the control circuit component 113 are mounted on the same surface of the electric circuit board 119. Thus, the projection amount $H_1'$ in the Y-axis direction of the control circuit component 113 in the optical transmission module 100 as a whole is a value obtained by subtracting the height $H_3'$ of the light emitting element 111 from the height $H_2'$ of the control circuit component 113. Therefore, in the optical transmission module 1, the projection amount of the control circuit component 13 in the entire module can be reduced by effectively using the step of the thickness D.

As a result, in the optical transmission module 1, the total height H can be made smaller than the sum of the height $H_2$ of the IC 13a, the height $H_4$ of the optical waveguide 10, and the thickness D of the first electric circuit board 9. Therefore, the entire module can be thinned according to the optical transmission module 1.

Furthermore, the strength of the entire module can be ensured by the stacked portion since the first electric circuit board 9 and the second electric circuit board 12 are stacked so as to form a step with each other in the optical transmission module 1.

Figure 5:
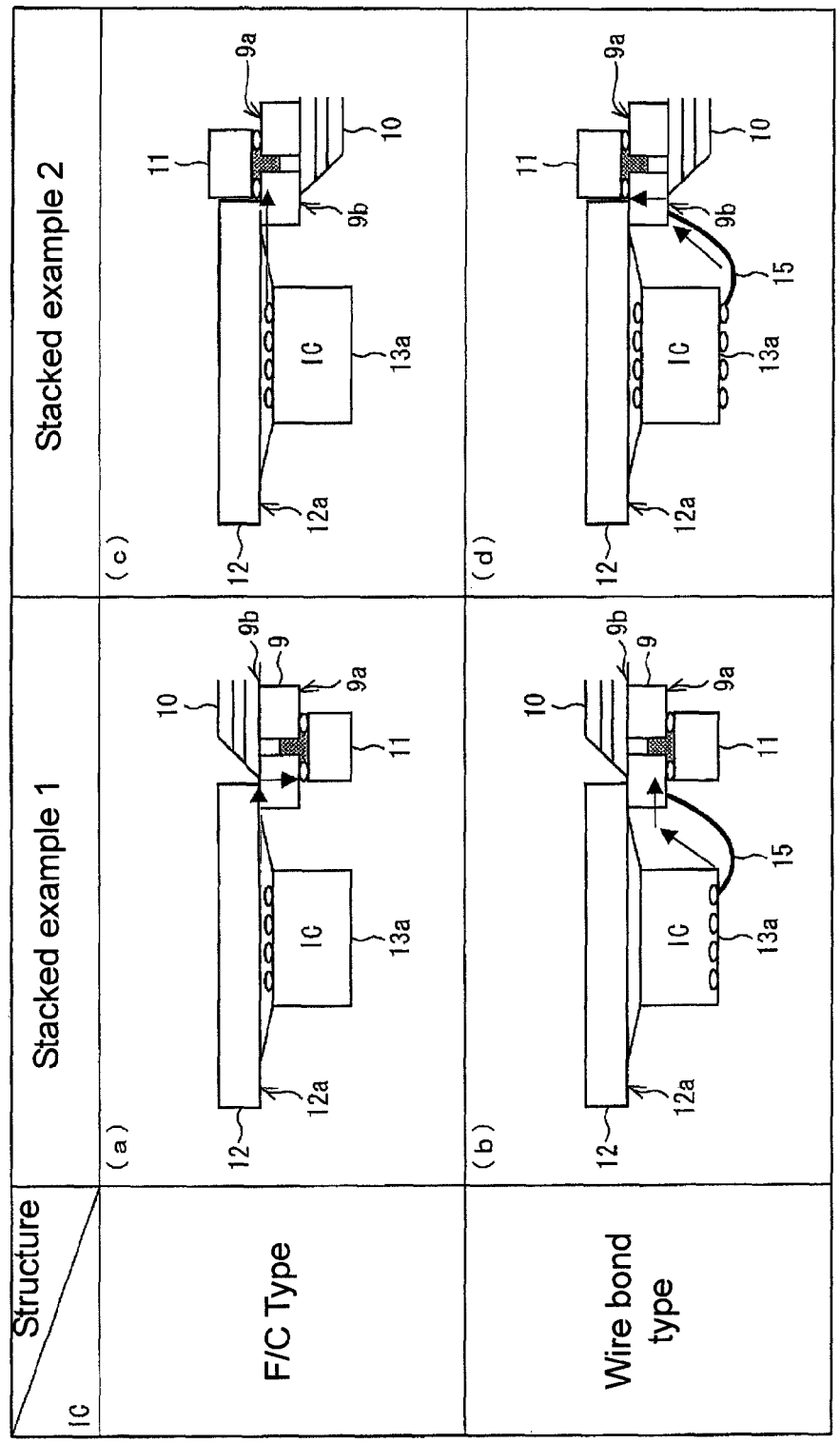
FIG. 5 is a view showing in a table form the stacked examples of the first electric circuit board and the second electric circuit board, and the electrical connecting example corresponding to each stacked example in the optical transmission module according to one embodiment of the present invention.

The optical transmission module 1 shown in FIG. 4 has a configuration (hereinafter referred to as stacked example 1) in which the second electric circuit board 12 is stacked on the surface 9b mounted with the optical waveguide 10 in the first electric circuit board 9. However, the optical transmission module 1 of the present embodiment may have a configuration (hereinafter referred to as stacked example 2) in which the second electric circuit board 12 is stacked on the surface 9a mounted with the optical element 11 in the first electric circuit board 9 as another configuration. The configuration of the optical transmission module 1 of the first and second stacked examples, and the electrical connection between the first electric circuit board 9 and the second electric circuit board 12 in each stacked example will be described in detail below with reference to FIG. 5. FIG. 5 is a view showing in a table form the stacked examples of the first electric circuit board 9 and the second electric circuit board 12, and the electrical connecting example corresponding to each stacked example in the optical transmission module 1 of the present embodiment. In FIG. 5, only the IC 13a, which is a representative component of the control circuit component 13, will be shown to simplify the figure.

First, the optical transmission module 1 of the first stacked example 1 has a configuration in which the second electric circuit board 12 is stacked on the surface 9b mounted with the optical waveguide 10 in the first electric circuit board 9, as shown in FIGS. 5A and 5B. The first stacked example corresponds to the configuration shown in FIG. 4. The optical transmission module 1 of the second stacked example is a configuration in which the second electric circuit board 12 is stacked on the surface 9a mounted with the optical element 11 in the first electric circuit board 9, as shown in FIGS. 5C and 5D.

In the optical transmission module 1 of the second stacked example, the step portion 14 formed by stacking the first electric circuit board 9 and the second electric circuit board 12 is formed by the surface 9b on which the optical waveguide 10 is mounted, the end face 9c, and the board surface 12a. The entire module is thinned by effectively using the step of the thickness D created by the step portion 14.

More specifically, in the optical transmission module 1 of the second stacked example, the projection height $H_1$ in the Y-axis direction of the IC 13a is a value obtained by subtracting the thickness D of the first electric circuit board 9 and the height $H_4$ of the optical waveguide 10 from the height $H_2$ of the IC 13a. Therefore, the projection amount of the IC 13a in the entire module can be reduced by effectively using the step of the thickness D in the optical transmission module 1. The total height H can be made smaller than the sum of the height $H_2$ of the IC 13a, the height $H_4$ of the optical waveguide 10, and the thickness D of the first electric circuit board 9.

When mounting various types of members of the optical transmission module 1, the upper surfaces of the optical element 11 (or the optical waveguide 10) and the control circuit component 13 (IC 13a, resistor 13b) can be made substantially the same by controlling the thickness of each electric circuit board. In this case, a thinner optical transmission module 1 can be realized.

The electrical connection between the first electric circuit board 9 and the second electric circuit board 12 in the optical transmission module 1 of the first and second stacked examples will be described below. Although not shown in FIGS. 5A to 5D, an electrical wiring for electrically connecting various types of members such as the optical element 11 and the IC 13a is formed on the surface 9a and the surface 9b of the first electric circuit board 9 as well as the board surface 12a of the second electric circuit board 12.

In the optical transmission module 1 of the first and second stacked examples, a semiconductor chip of flip chip mounting type (F/C type) and a semiconductor chip of wire bonding type (wire bond type) can be applied as the IC 13a.

Figure 6:
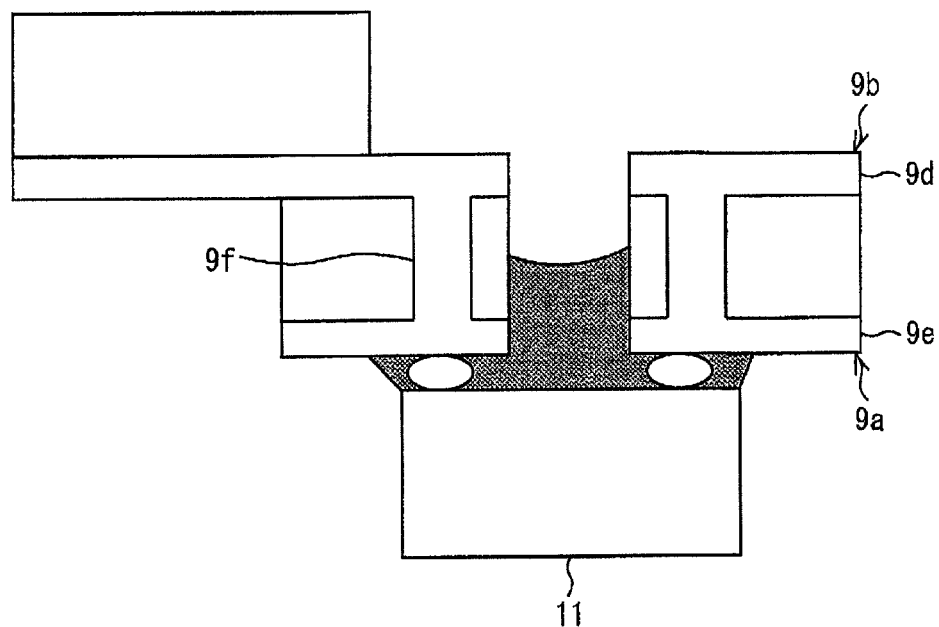
FIG. 6 is a cross-sectional view schematically showing the electrical connection between the surfaces of the first electric circuit board.

As shown in FIG. 5A, in the optical transmission module 1 of the first stacked example, when the F/C type IC 13a is mounted on the board surface 12a of the second electric circuit board 12, a through hole or a via hole that passes through the surface 9a and the surface 9b of the first electric circuit board 9 is formed to enable the electrical connection between the surface 9a and the surface 9b. First, the electrical connectional between the surface 9a and the surface 9b will be described based on FIG. 6. FIG. 6 is a cross-sectional view schematically showing the electrical connection between the surface 9a and the surface 9b of the first electric circuit board 9.

As shown in FIG. 6, electrical wirings 9d and 9e are formed on both surfaces, the surface 9a and the surface 9b, of the first electric circuit board 9. The electrical wiring 9d formed on the surface 9a is electrically connected with a connection terminal 11a of the optical element 11. A through hole or a via hole (hereinafter referred to as inter-layer connection line) 9f is formed to enable the electrical connection between the surface 9a and the surface 9b. The inter-layer connection line 9f is formed to electrically connect to the electrical wirings 9d and 9e.

The optical element 11 can be connected with the electrical wiring formed on the surface 9b by the inter-layer connection line 9f shown in FIG. 6. The electrical wiring formed on the surface 9b connects with the electrical wiring formed on the board surface 12a by the stacking of the first electric circuit board 9 and the second electric circuit board 12 (electrical wiring formed on the board surface 12a and electrical wiring formed on the surface 9b are in the same plane). The IC 13a is flip mounted on the board surface 12a, so that the electrical connection of the optical element 11 and the IC 13a is realized.

As shown in FIG. 5B, the wire bond type IC 13a may be mounted on the board surface 12a of the second electric circuit board 12 in the optical transmission module 1 of the first stacked example. In this case, the electrical wiring formed on the surface 9a mounted with the optical element 11 and the IC 13a are wire bonded by a wire 16. The electrical connection of the optical element 11 and the IC 13a is thereby realized.

In the optical transmission module 1 of the second stacked example, the F/C type IC 13a may be mounted on the board surface 12a of the second electric circuit board 12. In this case, the electrical wiring formed on the surface 9a is connected with the electrical wiring formed on the board surface 12a by the stacking of the first electric circuit board 9 and the second electric circuit board 12 (electric wiring formed on the board surface 12a and the electrical wiring formed on the surface 9a are on the same plane). The IC 13a is flip mounted on the board surface 12a, thereby realizing the electrical connection of the optical element 11 and the IC 13a.

In the optical transmission module 1 of the second stacked example, the wire bond type IC 13a may be mounted on the board surface 12a of the second electric circuit board 12. In this case, the electrical wiring formed on the surface 9b, on which the optical waveguide 10 is mounted, and the IC 13a are wire bonded by the wire 16. The electrical wiring formed on the surface 9b can be electrically connected with the optical element 11 by the inter-layer connection line 9f shown in FIG. 6.

In FIG. 5 and FIG. 6, a configuration in which the through hole or the via hole that passes through the surface 9a and the surface 9b of the first electric circuit board 9 is formed is adopted, but the optical transmission module 1 is not limited to such configuration. For instance, a configuration shown in FIG. 7 may be adopted. In such configuration, the through hole is not formed, and the first electric circuit board 9 is a transparent flexible board that can transmit light. The optical waveguide 10 and the optical element 11 are arranged so as to sandwich the first electric circuit board 9.

Figure 7:
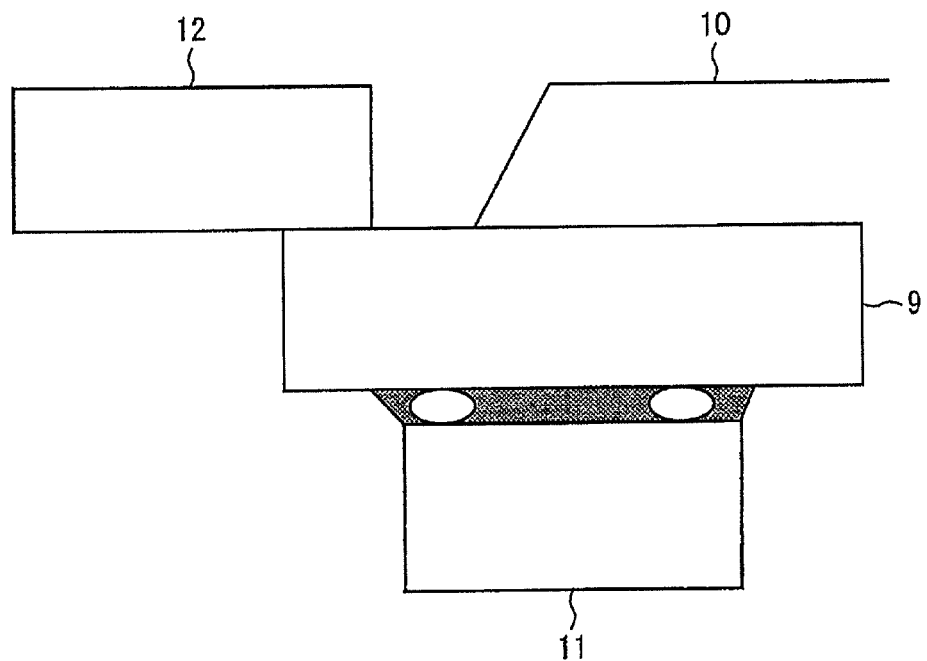
FIG. 7 is a cross-sectional view showing one example of a configuration of a first electric circuit board in the optical transmission module according to one embodiment of the present invention.

According to the configuration of FIG. 7, the light goes back and forth between the optical waveguide 10 and the optical element 11 through the first electric circuit board 9. That is, the optical coupling of the optical waveguide 10 and the optical element 11 through the first electric circuit board 9 serving as a transparent board is realized, a hole for transmitting the optical axis is not necessary, and hence enhancement in yield due to elimination of the positional shift of the hole and the optical axis, and miniaturization of the element since the need to install an element mounting pad while avoiding the hole is not necessary can be expected.

In the optical transmission module 1, the optical element 11 and the IC 13a are arranged by effectively using the step portion 14 formed by stacking the first electric circuit board 9 and the second electric circuit board 12. The following effects are thus obtained.

In the optical transmission module 1, the optical element 11 and the IC 13a are mounted while sandwiching the step portion 14 in the X-axis direction. Thus, the under fill shape of each adhesive can be easily controlled when mounting the optical element 11 and the IC 13a on the first electric circuit board 9 and the second electric circuit board 12 using the adhesive, and the IC 13a and the optical element 11 can be arranged proximate to each other.

Figure 25:
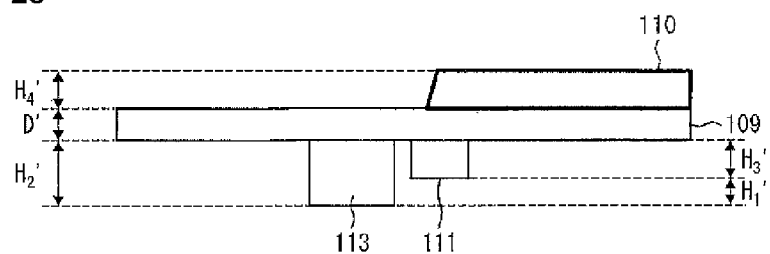
FIG. 25 is a view showing a configuration of a conventional optical transmission module.

In the conventional configuration shown in FIG. 25, the light emitting element 111 and the control circuit component 113 are mounted on the same surface of the electric circuit board 119. Thus, when arranging the light emitting element 111 and the control circuit component 113 on the electric circuit board 119, the under fill shape of the adhesive used to mount each member needed to be taken into consideration. The shape of the under fill of the adhesive for mounting the light emitting element 111 is controlled by the application amount of the adhesive.

Thus, in the conventional configuration shown in FIG. 25, when the light emitting element 111 and the control circuit component 113 are arranged proximate to each other, the adhesive for mounting the control circuit component 113 becomes a hindrance when applying the adhesive for mounting the light emitting element 111. Thus, the flow-in amount of the adhesive for mounting the light emitting element 111 to the light emitting element 111 becomes unstable, and the desired under fill shape may not be formed. Furthermore, the adhesive for mounting the control circuit component 113 may interfere with the light emitting element 111, and may affect the optical characteristics of the light emitting element 111. When a partition member is arranged between the control circuit component 113 and the light emitting element 111 to prevent interference of the adhesive for mounting the control circuit component 113, there is an increase in manufacturing step and an increase in board area.

In the conventional configuration shown in FIG. 25, when arranging the light emitting element 111 and the control circuit component 13 proximate to each other, the limit of the spaced distance between the light emitting element 111 and the control circuit component 13 is the minimum distance the under fill shape of the adhesive used to mount the light emitting element 111 and the control circuit component 13 does not interfere with each other.

In the optical transmission module 1, is avoided since the configuration in which the element 11 and the IC 13a are mounted while sandwiching the step portion 14 in the X-axis direction is adopted. In other words, when mounting the IC 13a on the board surface 12a of the second electric circuit board 12 using the adhesive, the adhesive is stopped at the step portion 14. The adhesive for mounting the IC 13a thus does not interfere to the mounting position of the optical element 11 (under fill shape of adhesive). Thus, in the optical transmission module 1, the optical element 11 and the IC 13a can be arranged at the spaced distance smaller than the minimum distance at which the under fill shape of the adhesive does not interfere with each other, which is assumed as the limit in the conventional configuration shown in FIG. 25.

The transmission characteristics of the optical transmission module 1 become more satisfactory as the spaced distance between the optical element 11 and the IC 13a becomes closer since a high speed signal is generally transmitted between the optical element 11 and the IC 13a. In particular, if the optical element 11 is a light emitting element such as VCSEL, unless the spaced distance between the optical element 11 and the IC 13a is made small, the waveform of the electric signal output from the IC 13a and the waveform of the optical signal emitted from the optical element 11 become blunt and the transmission of the optical signal in the optical waveguide 10 may not be possible. In the optical transmission module 1, the transmission of the optical signal in the optical waveguide 10 is satisfactory since the optical element 11 and the IC 13a can be arranged proximate to each other without taking the under fill shape of the adhesive into consideration.

In the optical transmission module 1, a recess $9_{con}$ and a recess $12_{con}$ are formed towards the inner side of the electric circuit board on one side out of the four sides at the periphery of the first electric circuit board 9 and the second electric circuit board 12, respectively, and the two opposing surfaces of the recess $9_{con}$ and the recess $12_{con}$ according to one or more embodiments of the present invention sandwich the optical waveguide 10, the optical element 11, or the control circuit component 13.

Figure 8:
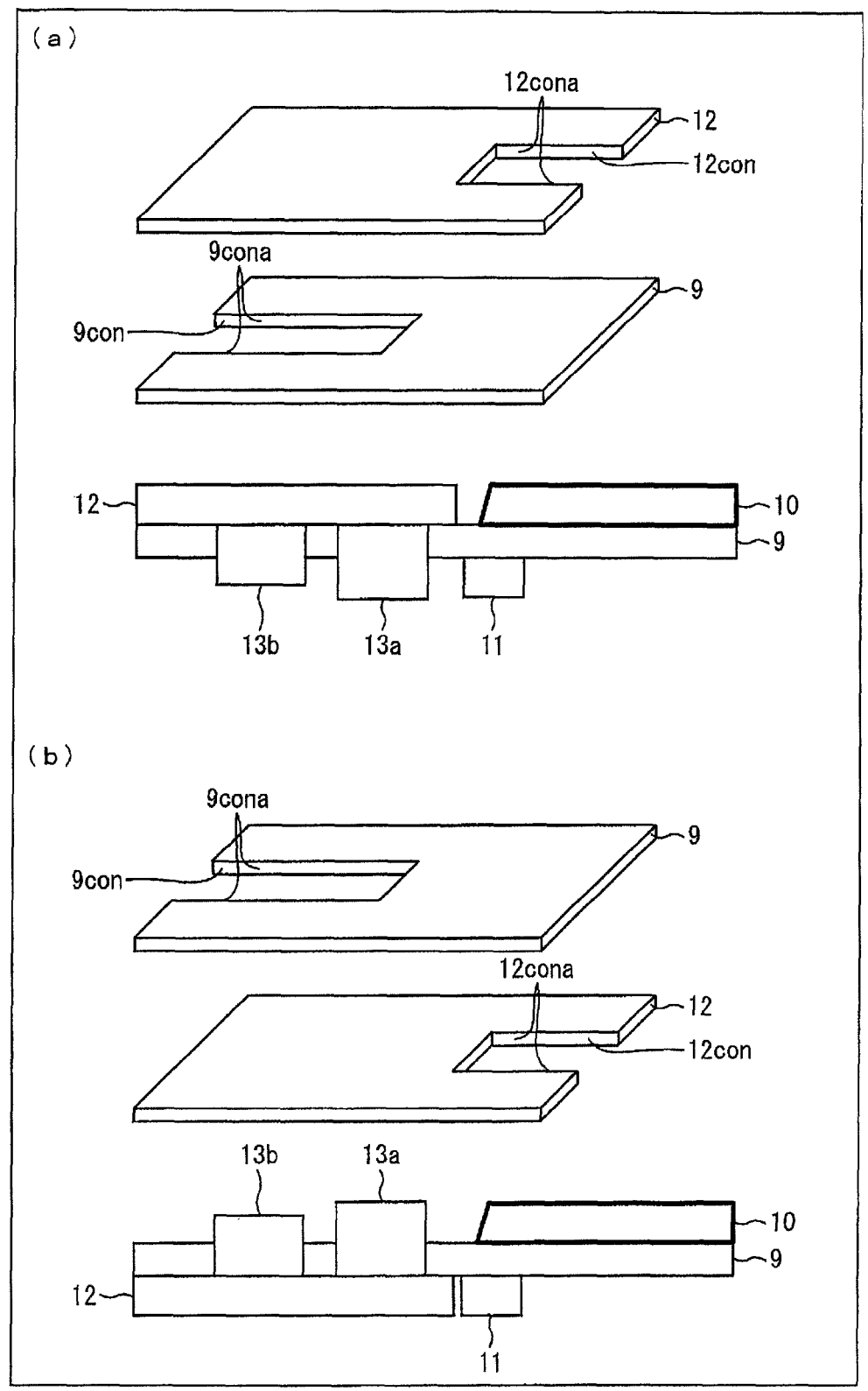
FIGS. 8(a) and 8(b) show a perspective view and a cross-sectional view showing the arrangement of the first electric circuit board and the second electric circuit board in the optical transmission module in which a recess is formed in each of the first electric circuit board and the second electric circuit board, where

According to such configuration, the step portion 14 including the two opposing surfaces in the recess $9_{con}$ and the recess $12_{con}$ is formed to sandwich the optical waveguide 10, the optical element 11, or the control circuit component 13. The effect that the strength of the entire module further enhances is thus obtained. The optical transmission module in which the recess $9_{con}$ and the recess $12_{con}$ are formed in the first electric circuit board 9 and the second electric circuit board 12, respectively, will be described below with reference to FIG. 8. FIG. 8 shows a perspective view and a cross-sectional view showing the arrangement of the first electric circuit board 9 and the second electric circuit board 12 in the optical transmission module 1, where FIG. 8(a) shows the optical transmission module 1 of the first stacked example, and FIG. 8(b) shows the optical transmission module 1 of the second stacked example 2.

As shown in FIGS. 8(a) and 8(b), the first electric circuit board 9 and the second electric circuit board 12 are respectively formed with the recess $9_{con}$ and the recess $12_{con}$. Each of the recess $9_{con}$ and the recess $12_{con}$ has a configuration of being recessed towards the inner side of the first electric circuit board 9 and the second electric circuit board 12.

Furthermore, as shown in the cross-sectional views of FIGS. 8(a) and 8(b), the two opposing surfaces $9_{con}a$ of the recess $9_{con}$ in the first electric circuit board 9 are formed to surround the control circuit component 13. Furthermore, as shown in the cross-sectional view of FIG. 8(a), the two opposing surfaces $12_{con}a$ of the recess $12_{con}$ in the second electric circuit board 12 are formed to surround the optical waveguide 10. As shown in the cross-sectional view of FIG. 8(b), the two opposing surfaces $12_{con}a$ of the recess $12_{con}$ in the second electric circuit board 12 are formed to surround the optical element 11.

According to the configuration shown in FIGS. 8(a) and 8(b), the step portion 14 formed by stacking the first electric circuit board 9 and the second electric circuit board 12 is configured to include the two surfaces $9_{con}a$ and the two surfaces $12_{con}a$. That is, various types of members such as the optical waveguide 10, the optical element 11 and the control circuit component 13 are accommodated in the recess $9_{con}$ and the recess $12_{con}$, and the strength of the entire module by the stacking is further enhanced.

One example of a method for manufacturing the optical transmission module 1 shown in FIGS. 8(a) and 8(b) will now be described with reference to FIGS. 9(a) to 9(e). FIGS. 9(a) to 9(e) are cross-sectional views and top views showing various steps of the method for manufacturing the optical transmission module 1 shown in FIGS. 8(a) and 8(b).

Figure 9:
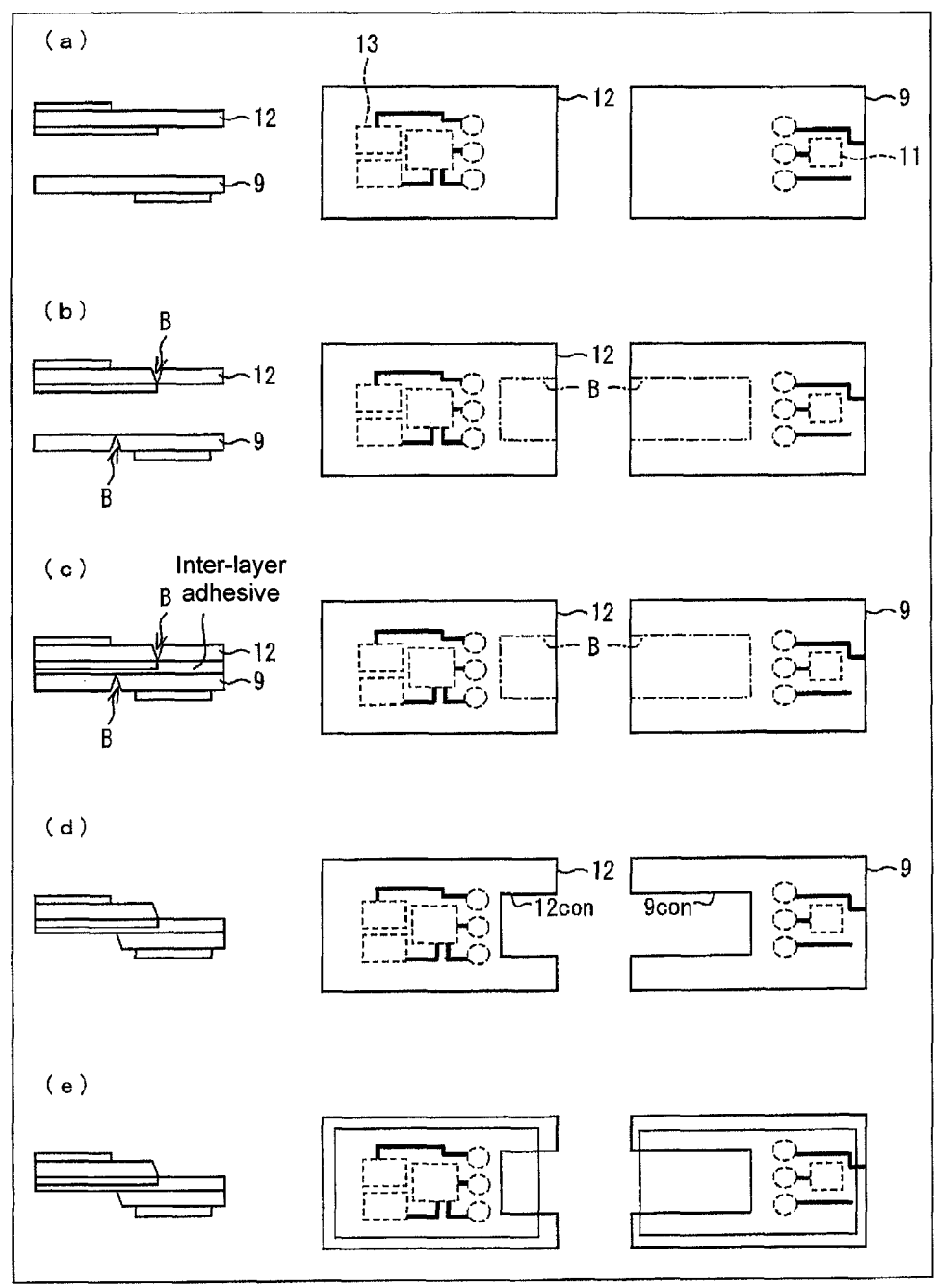
FIGS. 9(a) to 9(e) are cross-sectional views and top views showing various steps of the method for manufacturing the optical transmission module shown in FIGS. 8(a) and 8(b).

First, as shown in FIG. 9(a), a desired electrical wiring pattern is formed on the first electric circuit board 9 and the second electric circuit board 12. In this case, a mounting region for mounting the control circuit component 13 and the optical element 11 is ensured on the pattern forming surface of the first electric circuit board 9 and the second electric circuit board 12.

The recess $9_{con}$ and the recess $12_{con}$ are formed in the first electric circuit board 9 and the second electric circuit board 12, respectively. In this step, a half cut line B is formed in the first electric circuit board 9 and the second electric circuit board 12.

Thereafter, as shown in FIG. 9(c), the first electric circuit board 9 and the second electric circuit board 12 are laminated using an adhesive (stacking step). In this case, the half cut line B of the first electric circuit board 9 and the half cut line B of the second electric circuit board 12 are arranged to be alternate to each other.

As shown in FIG. 9(d), the portion surrounded with the half cut line B in the first electric circuit board 9 and the second electric circuit board 12 is removed and stripped to form the recess $9_{con}$ and the recess $12_{con}$. In this case, the recess $9_{con}$ and the recess $12_{con}$ are respectively formed in the direction towards the inner side of the first electric circuit board 9 and the second electric circuit board 12, and hence the stripping direction merely needs to be in one direction. The manufacturing of the optical transmission module thus becomes easy and convenient.

Thereafter, as shown in FIG. 9(e), an individual piece punching of the stacked structure of the first electrical circuit board 9 and the second electrical circuit board 12 laminated with respect to each other is carried out, and the outer shape is processed.

The first electric circuit board 9 and the second electric circuit board 12 stacked to form a step from each other are manufactured through the steps of FIGS. 9(a) to 9(e). The optical waveguide 10, the optical element 11, and the control circuit component 13 are then mounted (mounting step) after the steps of FIGS. 9(a) to 9(e) to complete the optical transmission module 1.

(First Variant)

Figure 10:
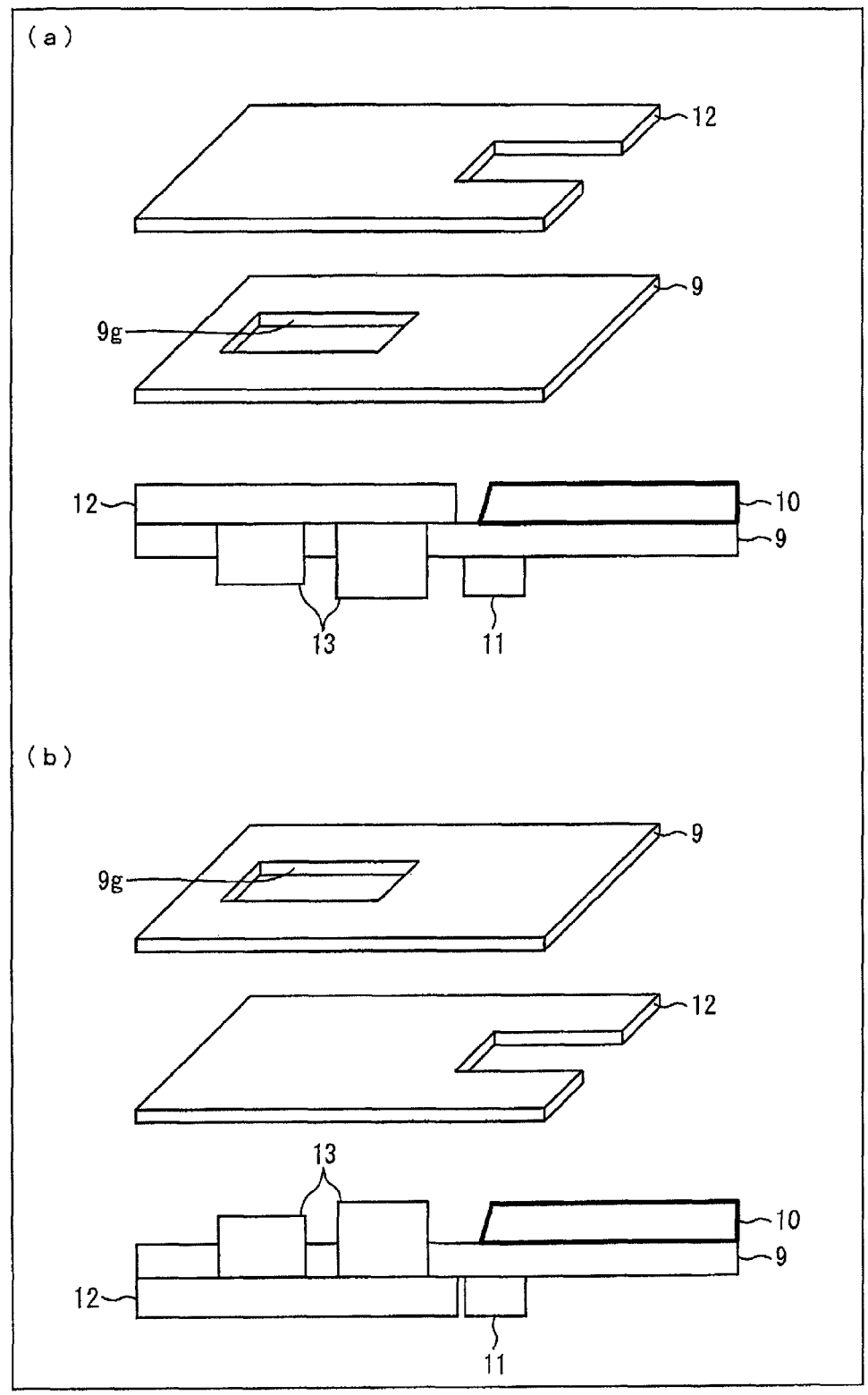
FIGS. 10(a) and 10(b) are a perspective view and a cross-sectional view showing the arrangement of the first electric circuit board and the second electric circuit board in the optical transmission module serving as a first variant, where

A variant of the configuration shown in FIGS. 8(a) and 8(b) will be described for the configuration of the optical transmission module 1 of the present embodiment. FIG. 10 is a perspective view and a cross-sectional view showing the arrangement of the first electric circuit board 9 and the second electric circuit board 12 in the optical transmission module 1 serving as the first variant, where FIG. 10(a) shows the optical transmission module 1 of the first stacked example and FIG. 10(b) shows the optical transmission module 1 of the second stacked example.

As shown in the figure, in the first variant, an opening 9g passing in the stacked direction is formed in the first electric circuit board 9, and the side surfaces forming the opening 9g surround the control circuit component 13. According to such configuration, the entire periphery of the control circuit component 13 is surrounded by the step portion 14 including the side surfaces forming the opening 9g. Thus, when sealing the control circuit component 13 using a sealant, the leakage of the sealant to the outside can be prevented.

(Second Variant)

Figure 11:
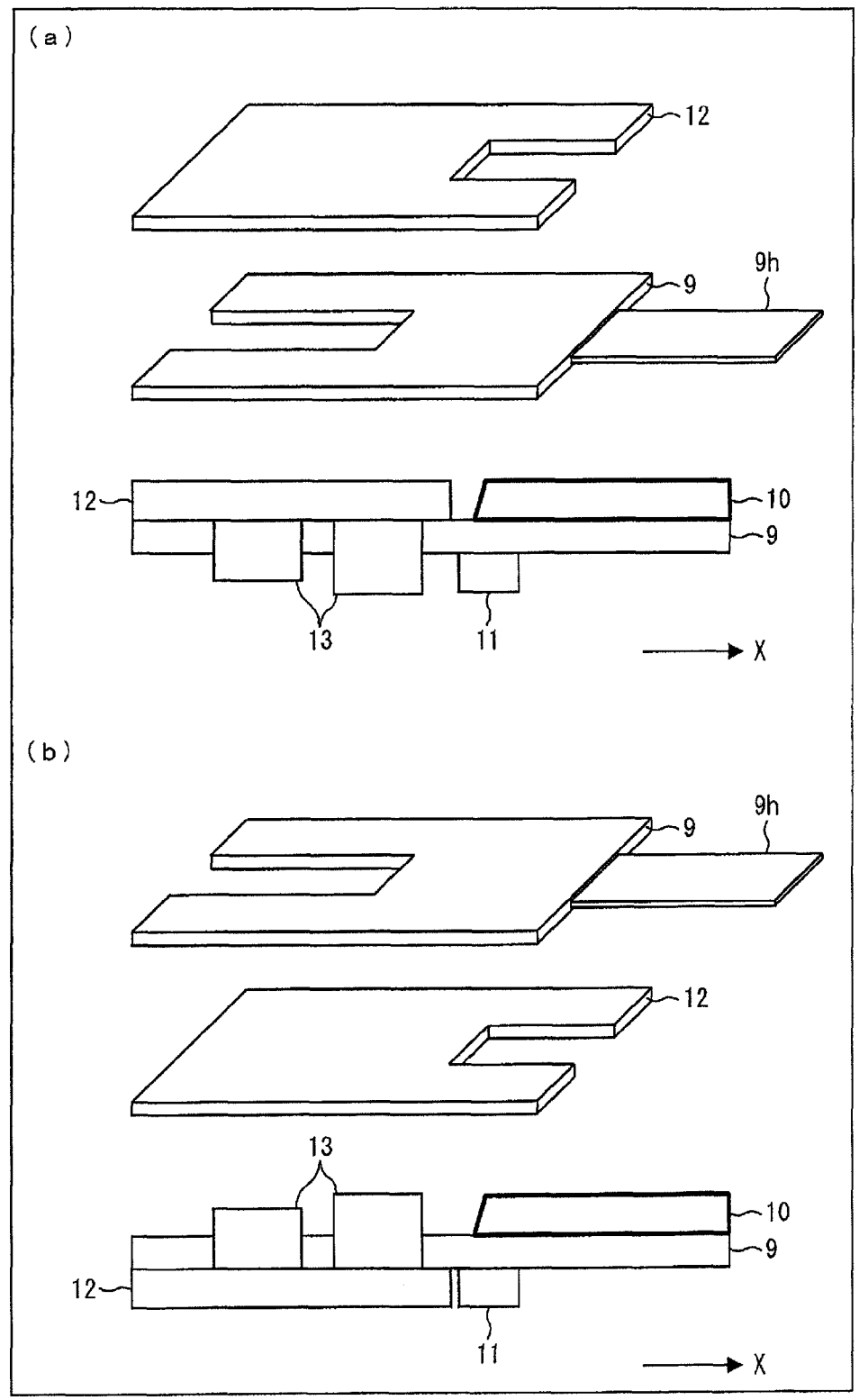
FIGS. 11(a) and 11(b) are a perspective view and a cross-sectional view showing the arrangement of the first electric circuit board and the second electric circuit board in the optical transmission module serving as a second variant, where

A variant of the configuration shown in FIGS. 8(a) and 8(b) will be described for the configuration of the optical transmission module 1 of the present embodiment. FIG. 11 is a perspective view and a cross-sectional view showing the arrangement of the first electric circuit board 9 and the second electric circuit board 12 in the optical transmission module 1 serving as the second variant, where FIG. 11(a) shows the optical transmission module 1 of the first stacked example and FIG. 11(b) shows the optical transmission module 1 of the second stacked example.

As shown in the figure, in the second variant, the first electric circuit board 9 includes a projection 9h projecting out in the optical axis direction (X-axis direction) of the optical waveguide 10. The projection 9h projects out to the side opposite to the control circuit component 13 side. The projection 9h is formed with a pattern of the electric circuit.

According to the configuration of the second variant, the electrical transmission path can be mounted on the projection 9h, and the power supply transmission that cannot be corresponded to the signal transmission and the electrical transmission directed to low speed transmission are enabled in the optical waveguide 10. In other words, according to the configuration of the second variant, the optical transmission module 1 enabling optical transmission and electrical transmission between the boards can be realized.

In the configuration of the second variant, the projection 9h (electric circuit pattern) in the first electric circuit board 9 and the optical waveguide 10 may be integrated. A method of integrating the first electric circuit board 9 and the optical waveguide 10 includes a method of laminating or adhering the optical waveguide 10 to the first electric circuit board 9, or a method of integrally forming the optical waveguide 10 with respect to the first electric circuit board 9 and removing the unnecessary portion.

According to such configuration, the first electric circuit board 9 and the optical waveguide 10 are fixed. Thus, the strength of the mounting portion of the first electric circuit board 9 of the optical waveguide 10 enhances. As a result, the mechanical stress from the outside such as tension of the optical transmission module 1 enhances.

(Third Variant)

Figure 12:
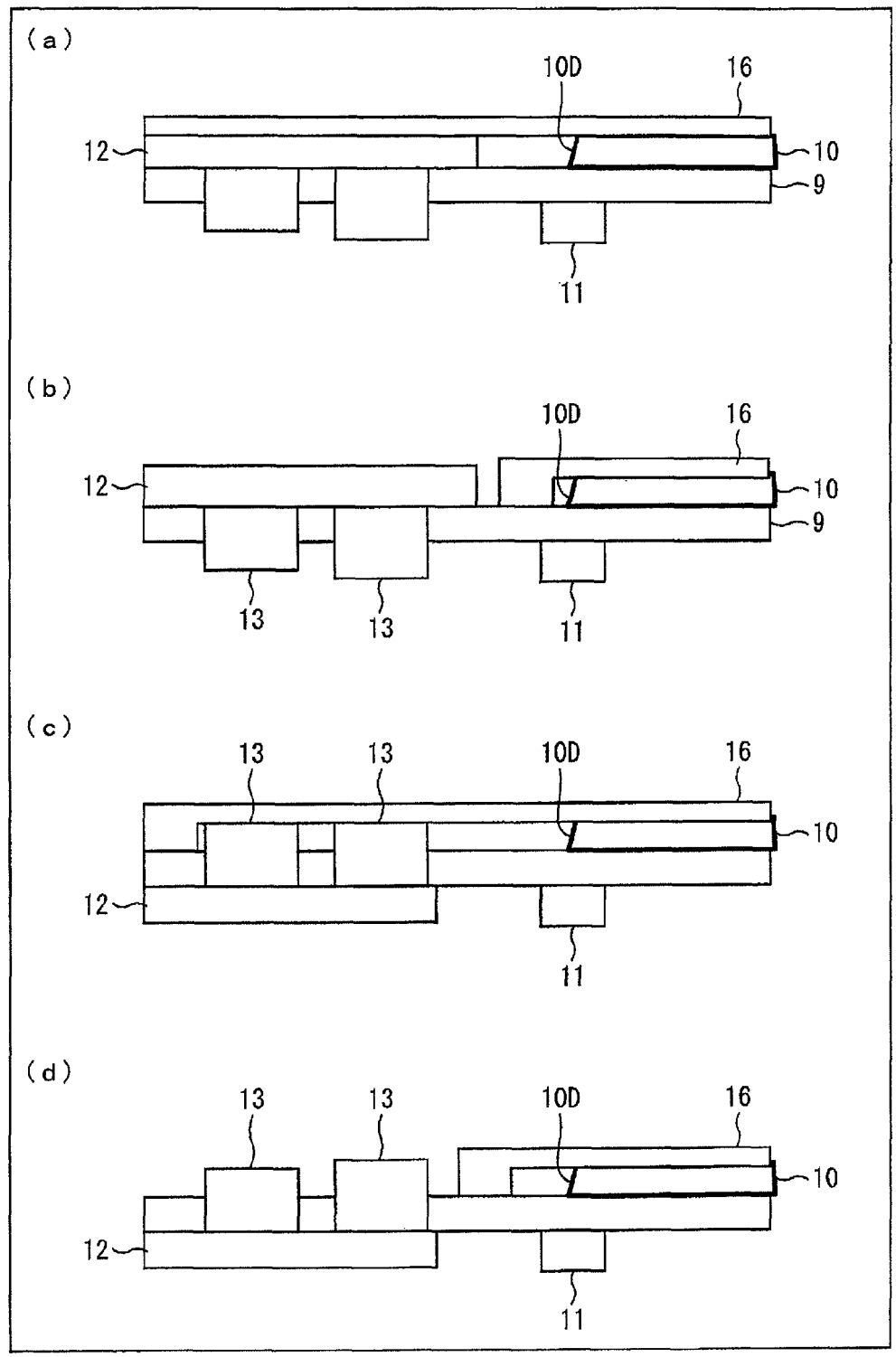
FIGS. 12(a) to 12(d) are cross-sectional views showing the configuration of the optical transmission module serving as a third variant, where

A variant of the configuration shown in FIGS. 8(a) and 8(b) will be described for the configuration of the optical transmission module 1 of the present embodiment. FIG. 12 is a cross-sectional view showing the configuration of the optical transmission module 1 serving as the third variant, where FIGS. 12(a) and 12(b) show the optical transmission module 1 of the first stacked example and FIGS. 12(c) and 12(d) show the optical transmission module 1 of the second stacked example.

As shown in the figure, in the third variant, a lid member 16 is arranged on the side to be mounted with the optical waveguide 10 of the optical transmission module 1. The lid member 16 is arranged to cover at least an optical path conversion mirror surface 10D of the optical waveguide 10.

Specifically, in the optical transmission module 1 of the first stacked example, the lid member 16 is arranged as a layer mounted on the second electric circuit board 12 and the optical waveguide 10, as shown in FIG. 12(a). Furthermore, as shown in FIG. 12(b), the lid member 16 is arranged so as to cover only the optical path conversion mirror surface 10D of the optical waveguide 10.

Moreover, in the optical transmission module 1 of the second stacked example, the lid member 16 is arranged as a layer mounted on the control circuit component 13 on the second electric circuit board 12 and the optical waveguide 10, as shown in FIG. 12(c). Furthermore, as shown in FIG. 12(d), the lid member 16 is arranged so as to cover only the optical path conversion mirror surface 10D of the optical waveguide 10.

According to such configuration, water droplets or dust are prevented from attaching to the optical path conversion mirror surface 10D of the optical waveguide 10.

The material of the lid member 16 is not particularly limited as long as it is a material that can be thinly molded and can be easily cutting worked. For instance, the material of the lid member 16 may be LCP, epoxy resin, or polycarbonate. The material of the lid member 16 according to one or more embodiments of the present invention is polyimide or polyimide amide due to the affinity of adhesiveness with respect to the first electric circuit board 9 or the second electric circuit board 12. The processing method of the lid member 16 may be resin molding, cutting, and drawing of resin film.

In addition, in the configuration of the third variant, external force such as tension is assumed to generate with respect to the optical waveguide 10. Therefore, an adhesive is filled between the lid member 16 and the optical waveguide 10 according to one or more embodiments of the present invention in the third variant.

(Variant 3-1)

Figure 13:
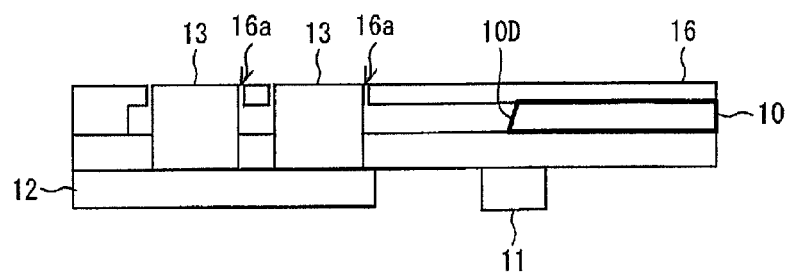
FIG. 13 is a cross-sectional view showing the configuration of the optical transmission module serving as a variant 3-1.

A variant of the configuration shown in FIG. 12(c) will be described for the configuration of the optical transmission module 1 of the third variant. FIG. 13 is a cross-sectional view showing the configuration of the optical transmission module 1 serving as variant 3-1.

As shown in the figure, in the variant 3-1, the lid member 16 is mounted on the optical waveguide 10 and is arranged to cover at least the optical path conversion mirror surface 10D. The lid member 16 includes an opening 16a. The control circuit component 13 is arranged to pass and expose the opening 16a.

With the configuration formed with the opening 16a, the optical transmission module 1 can be further thinned by the thickness of the lid member 16.

The lid member 16 is mounted on the optical waveguide 10 and functions as a reinforcement member of the optical transmission module 1. Thus, in the configuration of the variant 3-1, the thinning of the optical transmission module 1 and the enhancement of the strength both can be realized.

(Fourth Variant)

Figure 14:
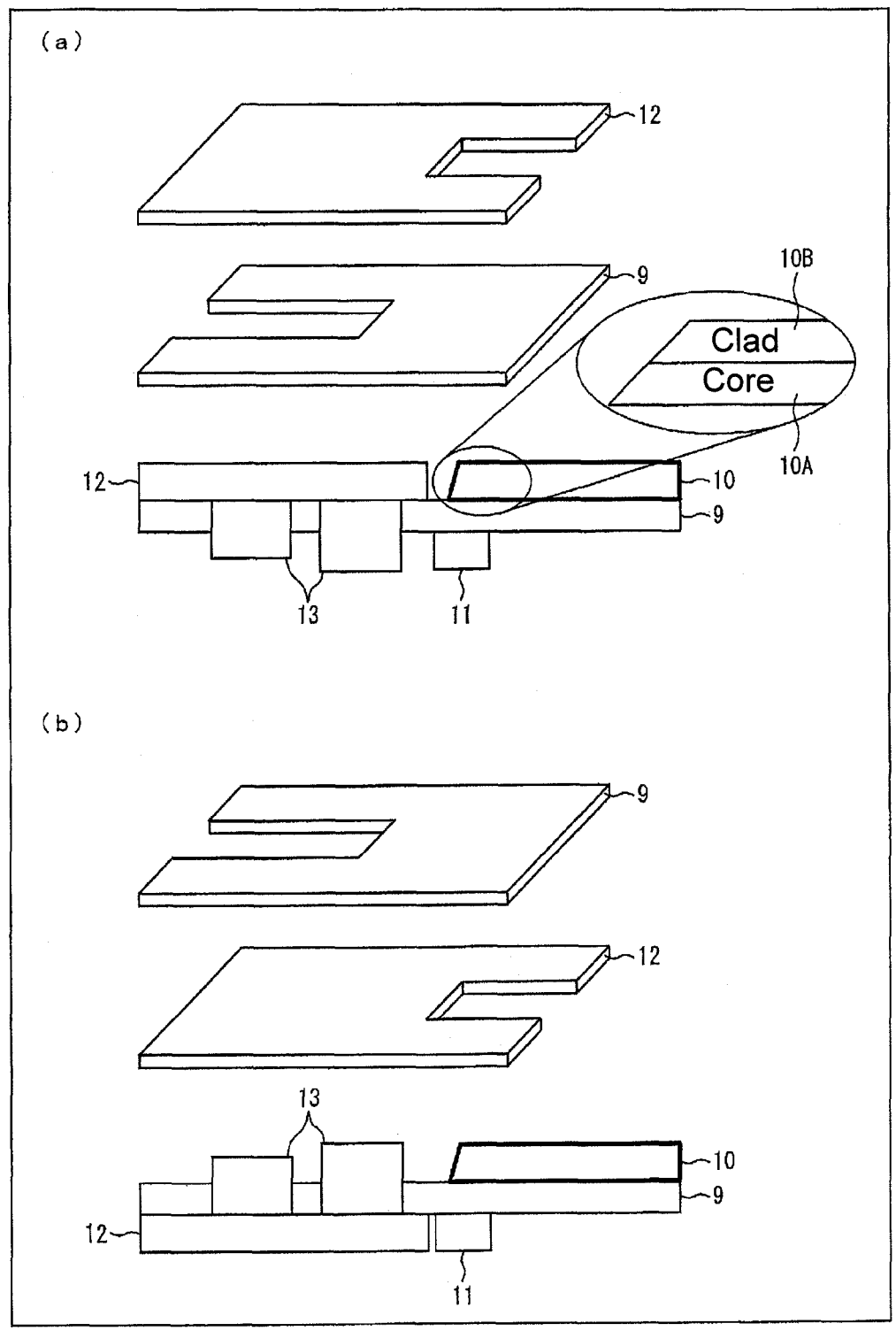
FIGS. 14(a) and 14(b) are a perspective view and a cross-sectional view showing the arrangement of the first electric circuit board and the second electric circuit board in the optical transmission module serving as a fourth variant, where

A variant of the configuration shown in FIGS. 8(a) and 8(b) will be described for the configuration of the optical transmission module 1 of the present embodiment. FIG. 14 is a perspective view and a cross-sectional view showing the arrangement of the first electric circuit board 9 and the second electric circuit board 12 in the optical transmission module 1 serving as the fourth variant, where FIG. 14(a) shows the optical transmission module 1 of the first stacked example and FIG. 14(b) shows the optical transmission module 1 of the second stacked example.

As shown in the figure, in the fourth variant, the first electric circuit board 9 is a transparent flexible board capable of transmitting light. The optical waveguide 10 is made up of a core 10A and an upper clad layer 10B. The first electric circuit board 9 serving as the transparent flexible board is responsible for the function of the lower clad layer 10C in the optical waveguide 10. Thus, the index of refraction of the first electric circuit board 9 is lower than the index of refraction of the core 10A in the fourth variant. The light goes back and forth between the optical waveguide 10 and the optical element 11 through the first electric circuit board 9. The first electric circuit board 9 according to one or more embodiments of the present invention is configured from a material capable of transmitting the light (e.g., light having wavelength of 850 nm, 1500 nm) to transmit.

According to the configuration of the fourth variant, the light goes back and forth between the optical waveguide 10 and the optical element 11 through the first electric circuit board 9, and thus the optical path hole (through hole or via hole) does not need to be formed in the first electric circuit board 9 and the number of manufacturing steps can be reduced. The optical transmission module 1 of the fourth variant has the number of layers of the optical waveguide 10 reduced by the lower clad layer 10C compared to the optical transmission module 1 shown in FIGS. 8(a) and 8(b). Thus, the entire optical transmission module 1 can be further thinned.

(Fifth Variant)

Figure 15:
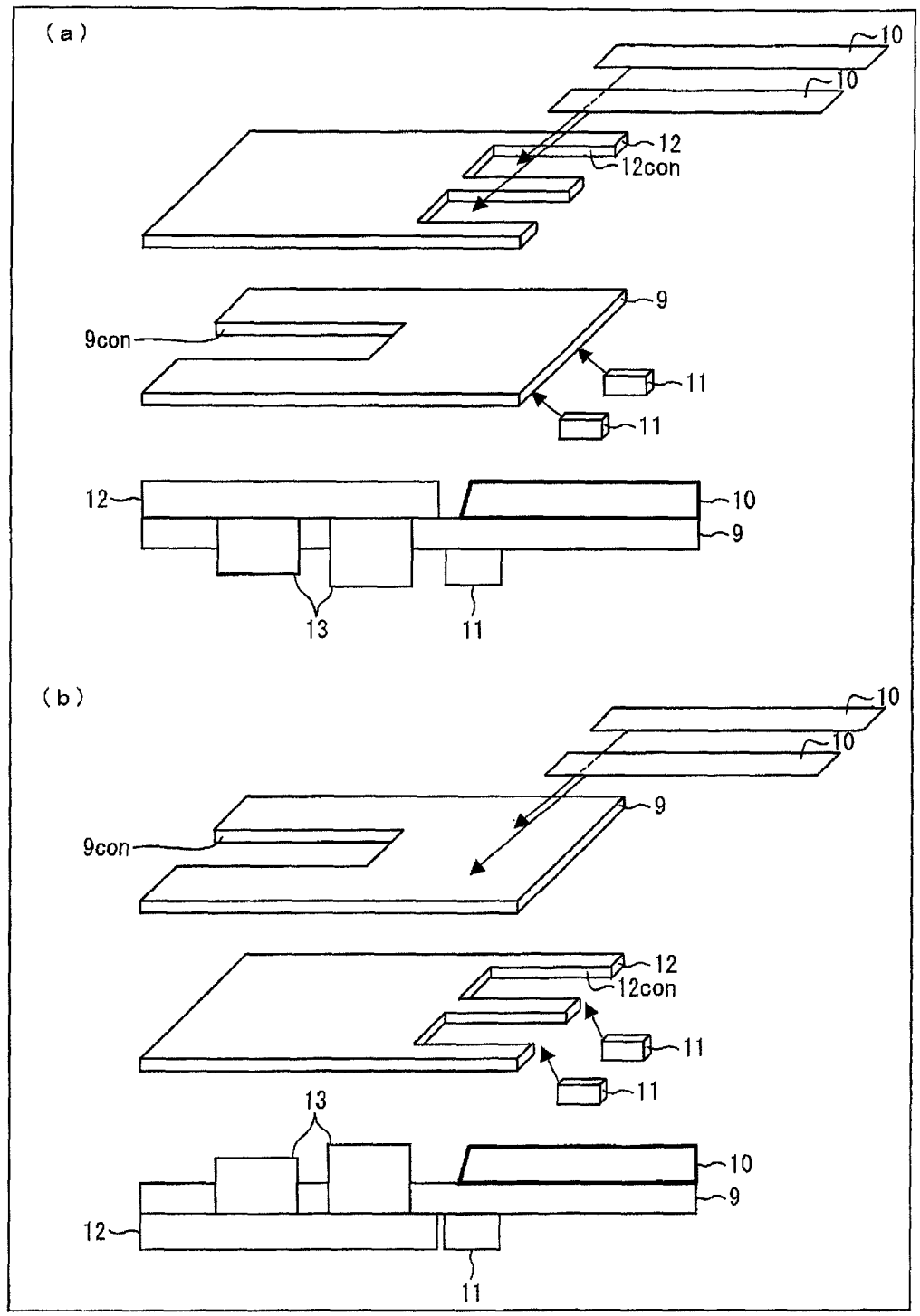
FIGS. 15(a) and 15(b) Are a perspective view and a cross-sectional view showing the arrangement of the first electric circuit board and the second electric circuit board in the optical transmission module serving as a fifth variant, where

A variant of the configuration shown in FIGS. 8(a) and 8(b) will be described for the configuration of the optical transmission module 1 of the present embodiment. FIG. 15 is a perspective view and a cross-sectional view showing the arrangement of the first electric circuit board 9 and the second electric circuit board 12 in the optical transmission module 1 serving as the fifth variant, where FIG. 15(a) shows the optical transmission module 1 of the first stacked example and FIG. 15(b) shows the optical transmission module 1 of the second stacked example.

As shown in the figure, in the fifth variant, two recesses $12_{con}$ recessed towards the inner side of the electric circuit board are formed on one side of the four sides at the periphery of the second electric circuit board 12. In the optical transmission module of the first stacked example, two opposing surfaces $12_{con}a$ of each recess $12_{con}$ sandwich the two optical waveguides 10. In the optical transmission module 1 of the second stacked example, two opposing surfaces $12_{con}a$ of each recess $12_{con}$ sandwich the two optical elements 11.

That is, the configuration of the fifth variant is a configuration in which two optical waveguides 10 are mounted on the first electric circuit board 9. In this case, the optical waveguides 10 or the optical elements 11 adjacent to each other are partitioned by a wall portion formed between the two recesses $12_{con}$. Thus, the optical paths between the optical waveguides 10 and the optical elements 11 adjacent to each other do not interfere. Therefore, the optical cross talk between the optical waveguides 10 adjacent to each other can be reduced in the fifth variant.

(Sixth Variant)

Figure 16:
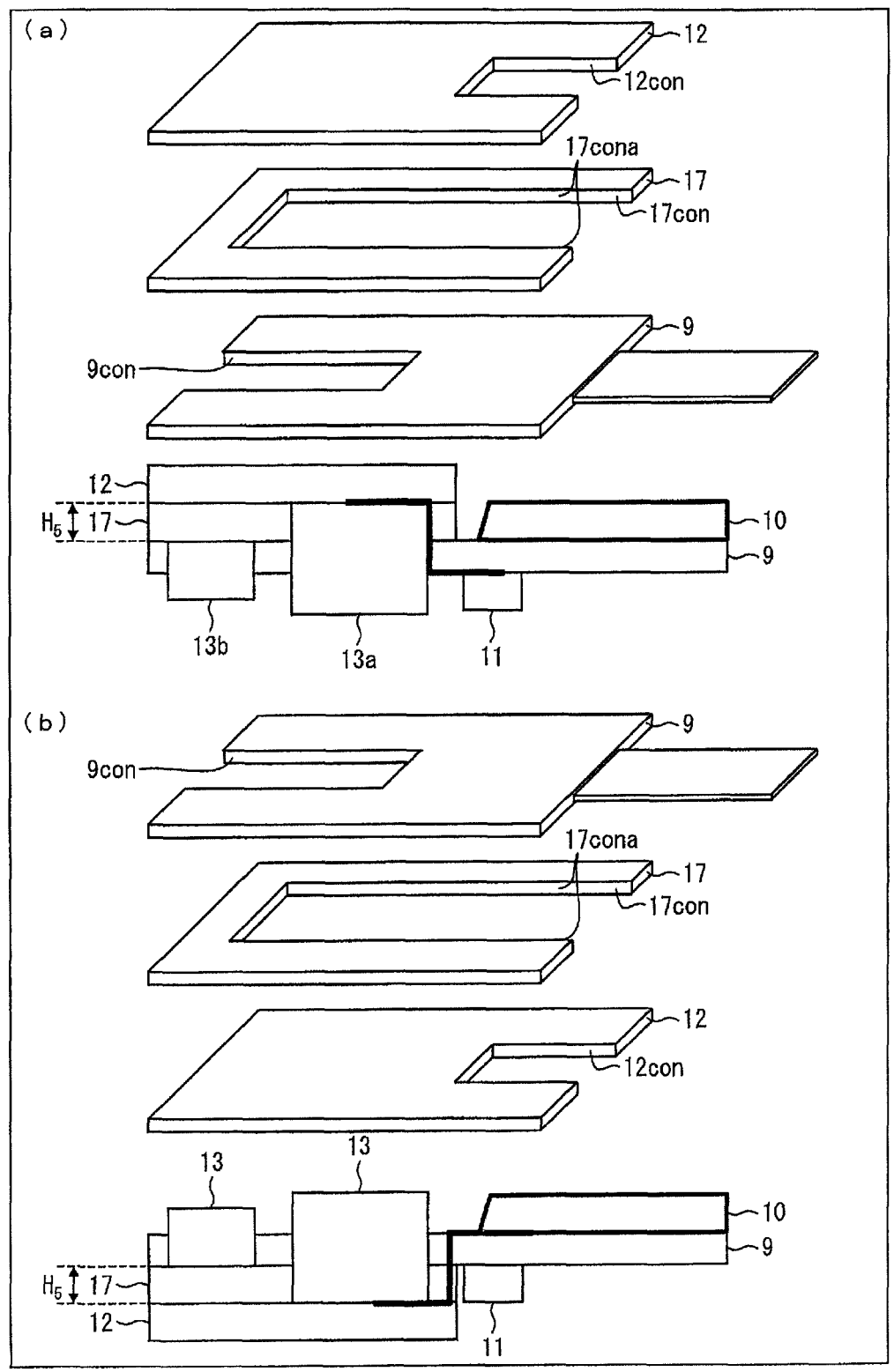
FIGS. 16(a) and 16(b) are a perspective view and a cross-sectional view showing the arrangement of the stacked electric circuit boards in the optical transmission module 1 serving as a sixth variant, where

A variant of the configuration shown in FIGS. 8(a) and 8(b) will be described for the configuration of the optical transmission module 1 of the present embodiment. FIG. 16 is a perspective view and a cross-sectional view showing the arrangement of the stacked electric circuit boards in the optical transmission module 1 serving as the sixth variant, where FIG. 16(a) shows the optical transmission module 1 of the first stacked example and FIG. 16(b) shows the optical transmission module 1 of the second stacked example.

The stacking number of electric circuit boards in the optical transmission module 1 is not limited to two. As shown in the figure, the stacking number of electric circuit boards may be three, In the optical transmission module 1 of the sixth variant, a plurality of electric circuit boards for mounting the optical waveguide 10, the optical element 11, and the control circuit component 13 includes the first electric circuit board 9, the second electric circuit board 12, and a third electric circuit board 17 arranged between the first electric circuit board 9 and the second electric circuit board 12. A recess $17_{con}$ recessed towards the inner side of the electric circuit board is formed on one side of the four sides at the periphery of the third electric circuit board 17. The recess $17_{con}$ is formed such that the two opposing surfaces $17_{con}a$ thereof sandwich the IC 13a of the control circuit component 13. That is, the third electric circuit board 17 is arranged to avoid the IC 13a. The IC 13a is mounted on the board surface 12a, on which the third electric circuit board 17 is stacked, of the first electric circuit board 9. The resistor 13b is mounted on the board surface 17a, on which the first electric circuit board 9 is stacked, of the third electric circuit board 17.

With the configuration of greater number of electric circuit boards stacked, the strength of the entire module can be enhanced. When mounting various types of members of the optical transmission module 1, the upper surfaces of the optical element 11 (or optical waveguide 10) and the control circuit component 13 (IC 13a, resistor 13b) can be made substantially the same by controlling the thickness of each electric circuit board. As a result, the gap of the step portion 14 formed by stacking the electric circuit boards is minimized, and the mechanical strength in handling and stress enhances for the entire module.

The stacking number of electric circuit boards is not limited to three, and may be an arbitrary stacking number as long as the following regulation regarding the height in the stacking direction of the stacked electric circuit boards is satisfied. In other words, the stacking number of electric circuit boards is arbitrary as long as the regulation that the height $H_5$ in the stacking direction of the electric circuit board arranged between the first electric circuit board 9 and the second electric circuit board 12 (third electric circuit board 17 in the configuration shown in FIGS. 16(a) and 16(b)) is the same as or less than the height of the maximum height control circuit component having the highest height in the stacking direction out of the plurality of control circuit components 13 is satisfied.

As long as the regulation regarding the height in the stacking direction of the electric circuit boards is satisfied, the periphery of the control circuit including the maximum height control circuit component can be completely surrounded or can be surrounded with one of the four sides opened to a horseshoe shape, thereby further enhancing the merit of thinning the module.

When the height $H_5$ in the stacking direction is higher than the height of the maximum height control circuit component, the height of the entire module becomes higher than the height of the maximum height control circuit component, and the merit of thinning of the module is not as great.

When the maximum height circuit control component is mounted on the board surface 12a of the second electric circuit board 12, the first electric circuit board 9 according to one or more embodiments of the present invention is a protective board for protecting the surface on the side opposite to the second electric circuit board 12 in the maximum height control circuit component. The water droplets or dust are thus prevented from attaching to the surface on the side opposite to the second electric circuit board 12 in the maximum height control circuit component.

The maximum height control circuit component includes the IC 13a (light emission drive IC or amplification IC). The height of the IC is about 300 μm. Thus, the height $H_5$ in the stacking direction is 300 μm or less. In this case, the stacking number of electric circuit boards can be appropriately set according to the height of each electric circuit board configuring the stacked structure.

For instance, in the configuration in which a plurality of electric circuit boards having a height of 100 μm is stacked so as to overlap each other, the limit T in the stacking number of electric circuit boards to be arranged between the first electric circuit board 9 and the second electric circuit board 12 is three. Therefore, the number of stacking number of electric circuit boards in the optical transmission module is five, which is a value obtained by adding the heights of the first electric circuit board 9 and the second electric circuit board 12 to the limit T.

(Seventh Variant)

Figure 17:
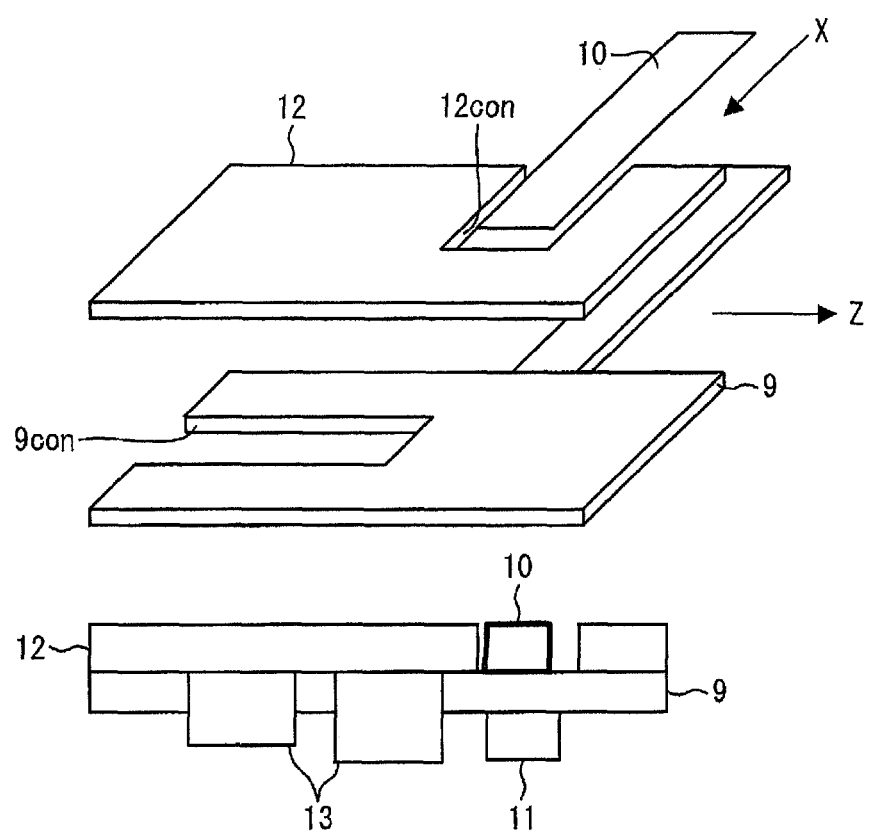
FIG. 17 is a perspective view and a cross-sectional view showing the arrangement of the optical waveguide, the first electric circuit board and the second electric circuit board in the optical transmission module 1 serving as a seventh variant, and shows the optical transmission module of the first stacked example.

A variant of the configuration shown in FIGS. 8(a) and 8(b) will be described for the configuration of the optical transmission module 1 of the present embodiment. FIG. 17 is a perspective view and a cross-sectional view showing the arrangement of the optical waveguide 10, the first electric circuit board 9, and the second electric circuit board 12 in the optical transmission module 1 serving as the seventh variant, and shows the optical transmission module 1 of the first stacked example.

As shown in the figure, in the seventh variant, the formed direction of the recess $12_{con}$ formed in the second electric circuit board 12 is perpendicular to the formed direction of the recess $9_{con}$ in the first electric circuit board 9. In other words, the one side formed with the recess $9_{con}$ of the four sides at the periphery of the first electric circuit board 9 and the one side formed with the recess $12_{con}$ of the four sides at the periphery of the second electric circuit board 12 are perpendicular to each other.

According to such configuration, the control circuit components 13 are arranged on the side surface side of the optical waveguide 10. In other words, the control circuit components 13 are arranged side by side in the Z-axis direction perpendicular to the optical axis direction (X-axis direction) and the Y-axis direction. According to such configuration, when the optical transmission module 1 is applied to a Snap-on connector, to be described later, for example, the connector is prevented from falling out from the optical transmission module 1 when force is applied in the width direction (Z-axis direction) of the optical transmission module 1.

(Eighth Variant)

Figure 18:
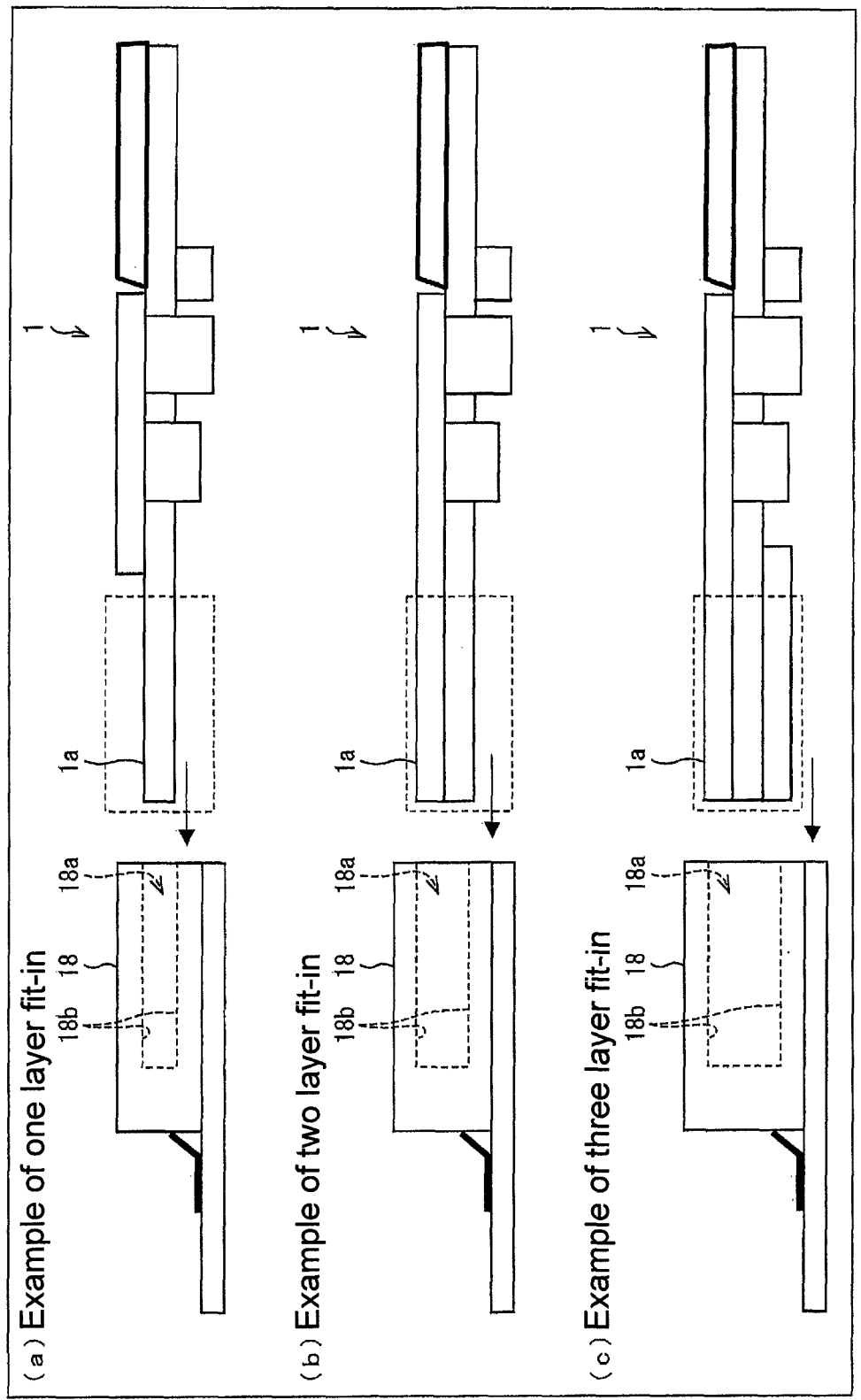
FIGS. 18(a) to 18(c) are cross-sectional views showing the configurations of the optical transmission module and the external connector serving as a first connection example.

In the following variant, a connection example in which the optical transmission module 1 is connected to an external connector will be described. FIGS. 18(a) to 18(c) are cross-sectional views showing the configurations of the optical transmission module 1 and the external connector serving as a first connection example.

As shown in FIG. 18(a), in the first connection example, an external connector 18 to be connected with the optical transmission module 1 includes a recess 18a depressed in the X-axis direction. The external connector 18 is a so-called Slide-in connector type. The recess 18a fits with the end in the X-axis direction of the optical transmission module 1. A fit-in portion 1a at the end in the X-axis direction of the optical transmission module 1 is the portion formed by stacking the first electric circuit board 9 and the second electric circuit board 12. In the example of FIG. 18(a), the fit-in portion 1a is the portion where the first electric circuit board 9 is projected out towards the end in the X-axis direction of the optical transmission module 1 as a result of stacking the first electric circuit board 9 and the second electric circuit board 12. Thus, in the configuration shown in FIG. 18(a), the interval of the two opposing surfaces 18b of the recess 18a is substantially equal to the thickness D of the first electric circuit board 9.

In the configuration shown in FIG. 18(b), the fit-in portion 1a at the end in the X-axis direction of the optical transmission module 1 has a configuration in which the first electric circuit board 9 and the second electric circuit board 12 are stacked up to the end in the X-axis configuration. In this case, the interval of the two opposing surfaces 18b of the recess 18a is substantially equal to the sum of the thicknesses of the first electric circuit board 9 and the second electric circuit board 12.

When the electric circuit boards in the optical transmission module 1 have a three-layer configuration (sixth variant), the interval of the two opposing surfaces 18b of the recess 18a is substantially equal to the sum of the thicknesses of the first to third electric circuit boards 12, as shown in FIG. 18(c).

(Ninth Variant)

Figure 19:
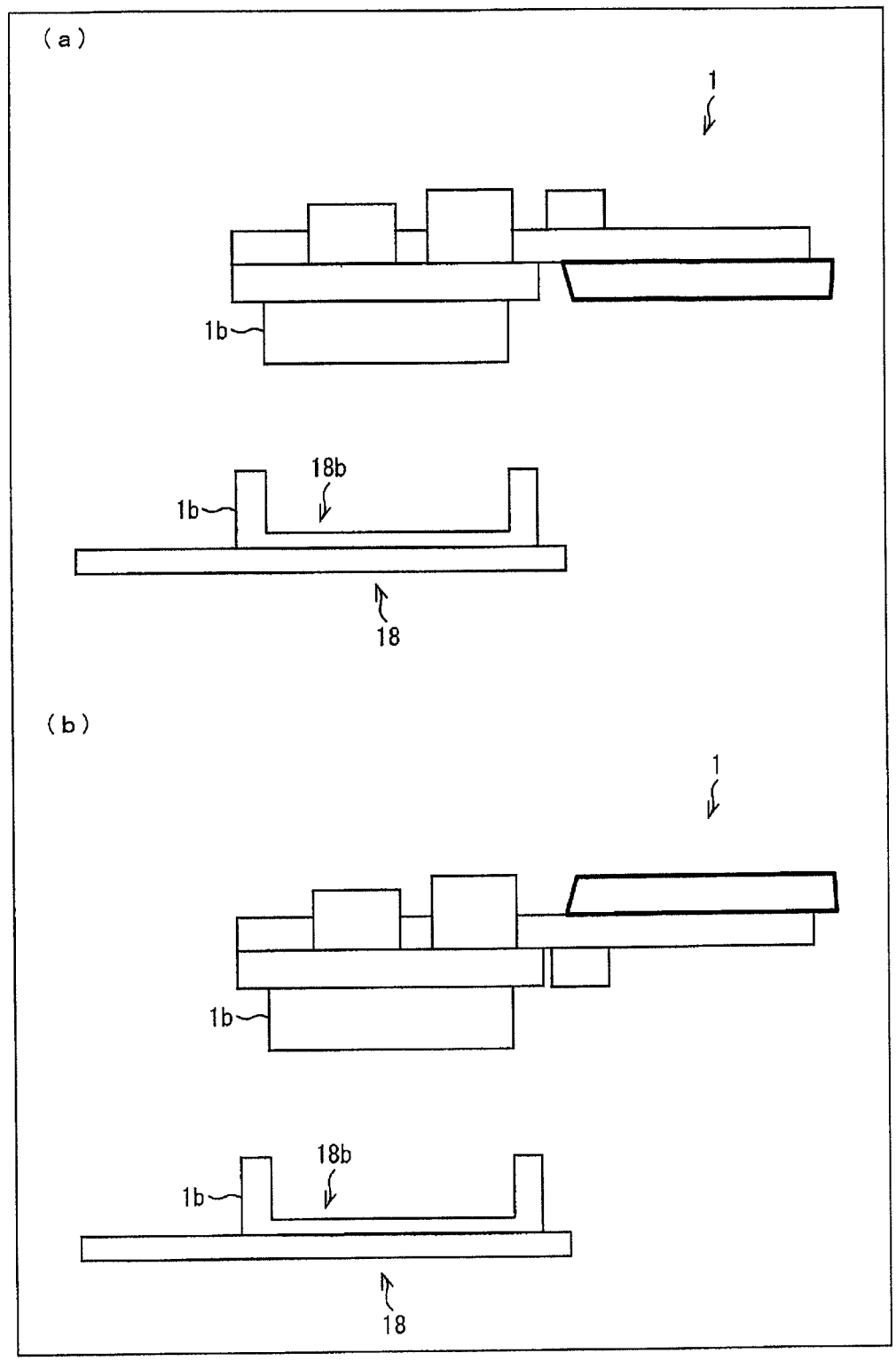
FIGS. 19(a) and 19(b) are cross-sectional views showing a configuration of the optical transmission module and the external connector serving as a second connection example, where

FIG. 19 is a cross-sectional view showing a configuration of the optical transmission module 1 and the external connector serving as a second connection example, where FIG. 19(a) shows the optical transmission module 1 of the first stacked example and FIG. 19(b) shows the optical transmission module 1 of the second stacked example.

As shown in the figure, the external connector 18 to be connected to the optical transmission module 1 has a recess 18b depressed in the Y-axis direction. The external connector 18 is a so-called Snap-on connector type. A fit-in portion 1b projecting out in the Y-axis direction is provided at the end in the X-axis direction of the optical transmission module 1. The recess 18b and the fit-in portion 1b are fitted to each other in the Y-axis direction of the optical transmission module 1.

Thus, the external connector 18 of Snap-on connector type can correspond to the connector method preferred for the hinge of the portable telephone, and can realize the thinning of the relevant portion. Furthermore, in the Snap-on connector type connection method, the external connector 18 is mounted from the direction (Y-axis direction) perpendicular to the electric circuit board, and thus the thickness of the entire module inevitably increases. The thinning can be achieved in the optical transmission module 1, and hence the optical wiring excellent in thinness can be provided even in the Snap-on type.

When adopting the connection method of Snap-on connector type, the terminal portion of the external connector 18 is desirably supported at the stacked portion of the plurality of electric circuit boards.

(Variant 9-1)

Figure 20:
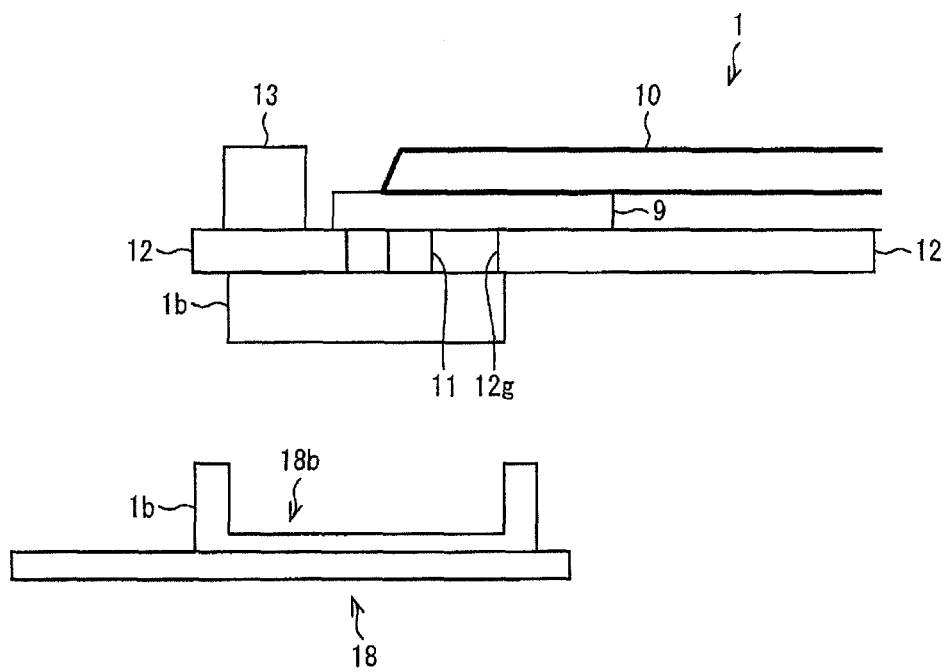
FIG. 20 is a cross-sectional view showing the configuration of the optical transmission module 1 serving as a variant 9-1.

A variant of the configuration shown in FIG. 19(b) will be described for the configuration of the optical transmission module 1 of a ninth example. FIG. 20 is a cross-sectional view showing the configuration of the optical transmission module 1 serving as a variant 9-1.

As shown in the figure, an opening 12g passing in the stacking direction is formed in the second electric circuit board 12, and the side surfaces forming the opening 12g surround the optical element 11. The fit-in portion 1b projecting out in the Y-axis direction is provided at the end in the X-axis direction of the optical transmission module 1, and the optical element 11 is arranged on the fit-in portion 1b (upper side in Y-axis direction). The recess 18b of the external connector 18 and the fit-in portion 1b are fitted in the Y-axis direction of the optical transmission module 1.

(Variant 9-2)

Figure 21:
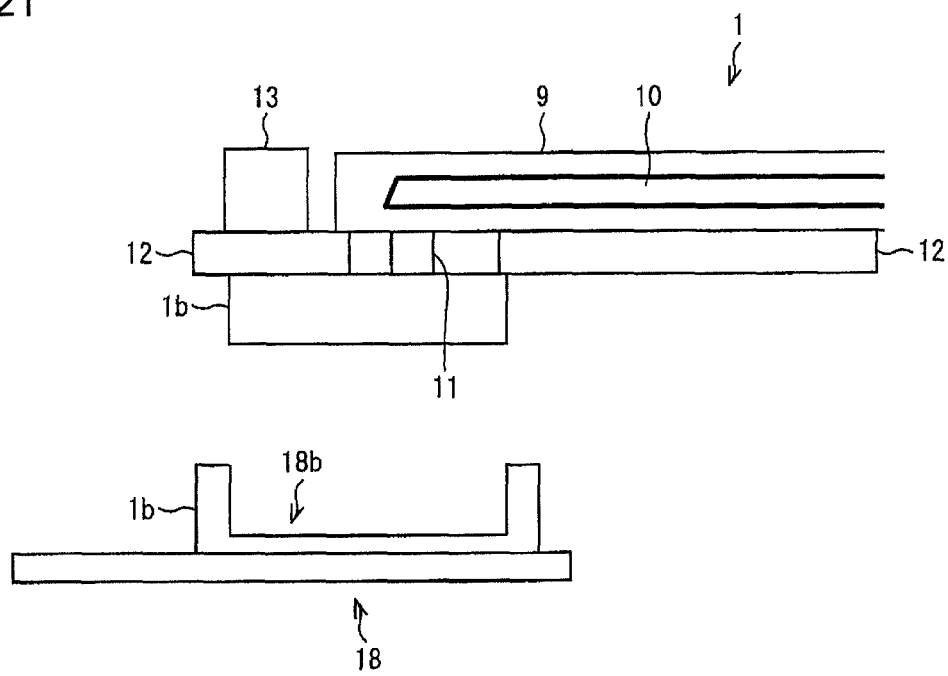
FIG. 21 is a cross-sectional view showing the configuration of the optical transmission module 1 serving as a variant 9-2.

Another variant of the configuration shown in FIG. 19(b) will be described for the configuration of the optical transmission module 1 of the ninth variant. FIG. 21 is a cross-sectional view showing the configuration of the optical transmission module 1 serving as a variant 9-2. As shown in the figure, the optical waveguide 10 is configured to be embedded in the first electric circuit board 9 in the variant 9-2.

In the optical transmission module 1 of the ninth variant applied with the connection method of the Snap-on connector type, the configurations of the variant 9-1 and the variant 9-2 may be adopted. The thinning of the optical transmission module 1 and the enhancement of the strength both can be realized.

Application Example

The optical transmission module 1 of the present embodiment can be applied to the following application examples.

As a first application example, use can be made at the hinge in the foldable electronic device such as the foldable portable telephone, the foldable PHS (Personal Handy phone System), the foldable PDA (Personal Digital Assistant), and the foldable notebook personal computer.

Figure 22:
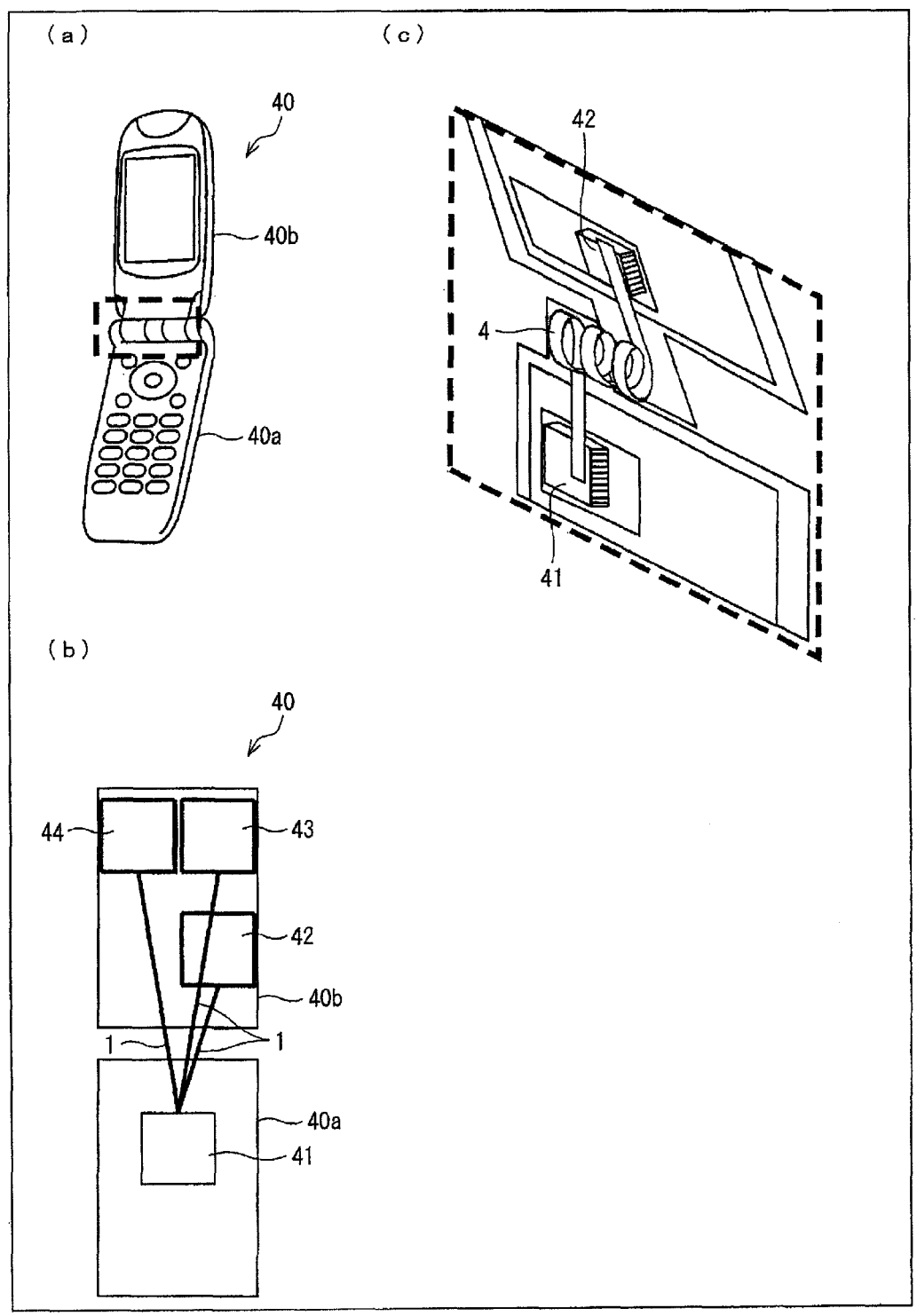
FIG. 22(a) is a perspective view showing an outer appearance of the foldable portable telephone including the optical transmission path according to one or more embodiments of the present invention.
FIG. 22(b) is a block diagram of the portion applied with the optical transmission path in the foldable portable telephone shown in FIG. 22(a)
FIG. 22(c) is a perspective plan view of a hinge in the foldable portable telephone shown in FIG. 22(a).

FIGS. 22(a) to 22(c) show an example in which the optical waveguide 10 is applied to the foldable portable telephone 40. In other words, FIG. 22(a) is a perspective view showing an outer appearance of the foldable portable telephone 40 incorporating the optical waveguide 10.

FIG. 22(b) is a block diagram of the portion applied with the optical waveguide 10 in the foldable portable telephone 40 shown in FIG. 22(a). As shown in the figure, a control unit 41 arranged on a main body 40a side in the foldable portable telephone 40, and an external memory 42, a camera (digital camera) 43, and a display unit (liquid crystal display) 44 arranged on a lid (drive unit) 40b side rotatably arranged at one end of the main body with the hinge as a shaft are respectively connected by the optical transmission path 4.

FIG. 22(c) is a perspective plan view of the hinge (portion surrounded with a broken line) in FIG. 22(a). Ad shown in the figure, the optical transmission path 4 connects the control unit arranged on the main body side, and the external memory 42, the camera 43, and the display unit 44 arranged on the lid side by being wrapped around a supporting rod at the hinge and bent.

The high speed and large capacity communication can be realized in a limited space by applying the optical waveguide 10 to the foldable electronic devices. Therefore, it is particularly suitable for devices that require high speed and large capacity data communication and that are demanded miniaturization such as the foldable liquid crystal display device.

As a second application example, the optical waveguide 10 can be applied to a device including the drive unit such as a printer head in a printing device (electronic device) and a reading unit in a hard disc recording and reproducing device.

Figure 23:
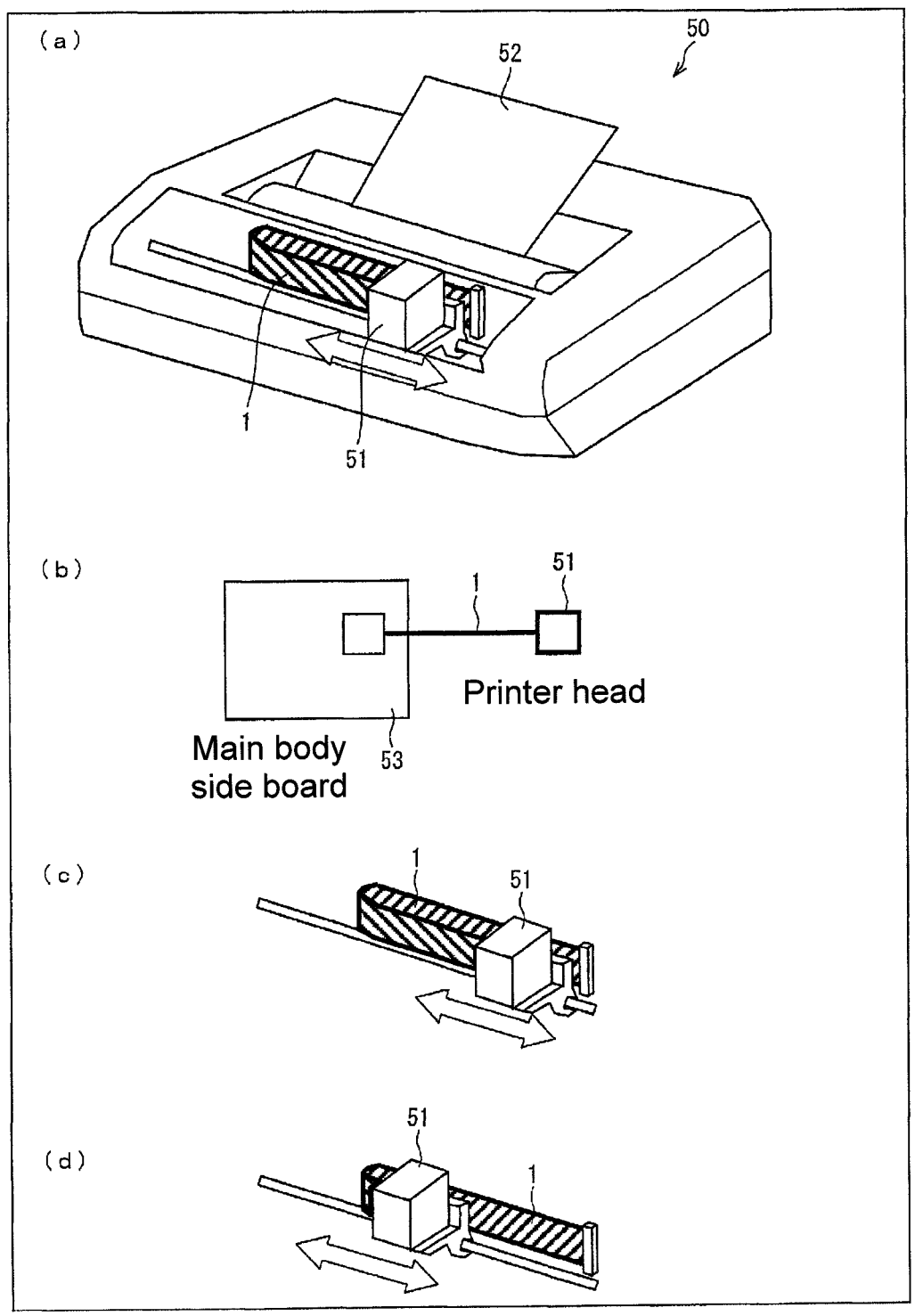
FIG. 23(a) is a perspective view showing an outer appearance of a printing device including the optical transmission path according to one or more embodiments of the present invention.
FIG. 23(b) is a block diagram showing the main parts of the printing device shown in FIG. 23(a), and FIGS. 23(c) and 23(d) are perspective views showing a curved state of the optical transmission path of when the printer head is moved (driven) in the printing device.

FIGS. 23(a) to 23(d) show an example in which the optical waveguide 10 is applied to a printing device 50. FIG. 23(a) is a perspective view showing an outer appearance of the printing device 50. As shown in the figure, the printing device 50 includes a printer head 51 for performing printing on a paper 52 while moving in a width direction of the paper 52, and one end of the optical waveguide 10 is connected to the printer head 51.

FIG. 23(b) is a block diagram of the portion applied with the optical waveguide 10 in the printing device 50. As shown in the figure, one end of the optical waveguide 10 is connected to the printer head 51, and the other end is connected to the main body side board in the printing device 50. The main body side board includes a control means for controlling the operation of each unit of the printing device 50, and the like.

FIGS. 23(c) and 23(d) are perspective views showing a curved state of the optical waveguide 10 of when the printer head 51 is moved (driven) in the printing device 50. As shown in the figure, when applying the optical waveguide 10 to the drive unit such as the printer head 51, the curved state of the optical transmission path 4 changes by the drive of the printer head 51, and each position of the optical waveguide 10 is repeatedly curved.

Therefore, the optical transmission module 1 according to the present embodiment is suitable for such drive units. The high speed and large communication using the drive unit can be realized by applying the optical transmission module 1 to the drive unit.

Figure 24:
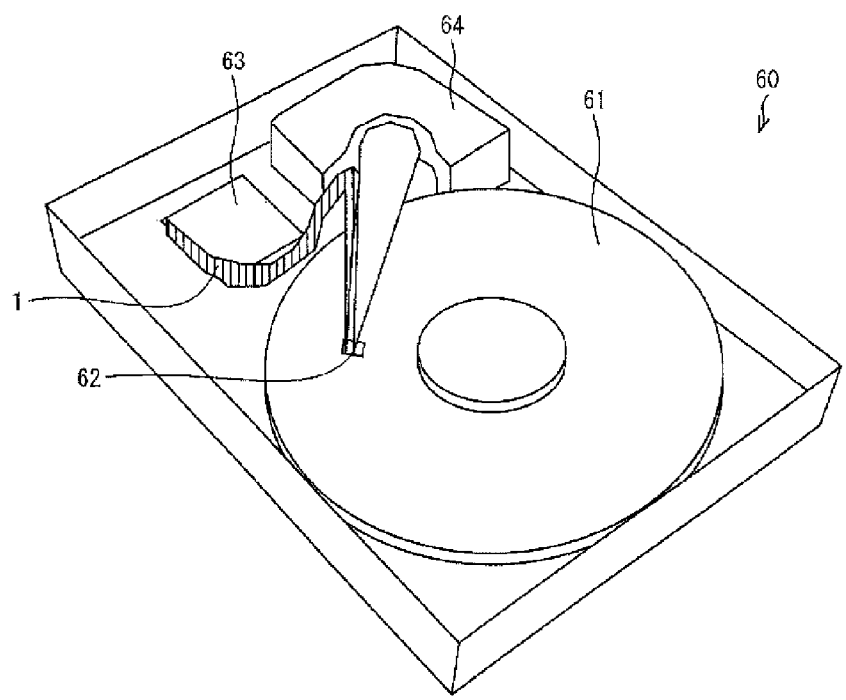
FIG. 24 is a perspective view showing an outer appearance of a hard disc recording and reproducing device including the optical transmission path according to one or more embodiments of the present invention.

FIG. 24 shows an example in which the optical waveguide 10 is applied to a hard disc recording and reproducing device 60.

As shown in the figure, the hard disc recording and reproducing device 60 includes a disc (hard disc) 61, a head (reading and writing head) 62, a board introducing unit 63, a drive unit (drive motor) 64, and the optical waveguide 10.

The drive unit 64 drives the head 62 along the radial direction of the disc 61. The head 62 reads the information recorded on the disc 61, and also writes the information on the disc 61. The head 62 is connected to the board introducing unit 63 by way of the optical waveguide 10, and propagates the information read from the disc 61 to the board introducing unit 63 as an optical signal or receives the optical signal of the information to write to the disc 61 propagated from the board introducing unit 63.

The high speed and large capacity communication can be realized by applying the optical waveguide 10 to the drive unit such as the head 62 in the hard disc recording and reproducing device 60.

The present invention is not limited to the above-described embodiments, and various modifications can be made within the scope defined by the Claims. In other words, the embodiments obtained by combining the technical means appropriately changed within the scope defined in the Claims are also encompassed in the technical scope of the present invention.

The optical transmission module according to the present invention can be applied to the optical communication path between the various types of devices, and can also be applied to a flexible optical wiring serving as an in-device wiring mounted in a compact and thin commercial-off-the-shelf device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS 1 optical transmission module
1a fit-in portion (first fit-in portion)
1b fit-in portion (second fit-in portion)
2 light transmission processing section
3 light reception processing section
4 optical wiring
4A light incidence plane
4B light emission plane
5 light emission drive unit (control circuit component)
6 light emitting unit (optical element)
7 amplification unit (control circuit component)
8 light receiving unit (optical element)
9 first electric circuit board (first board)
9a surface (both surfaces)
9b surface (both surfaces)
10 optical waveguide
11 optical element
12 second electric circuit board (second board)
13 control circuit component
14 step portion
17 third electric circuit board (third board)
18 external connector
18a recess (connector recess)
18b recess (vertical connector recess)

The invention claimed is:

1. An optical transmission module comprising:
an optical wiring for transmitting light; and
an optical element for irradiating a light incidence plane of the optical wiring with light and a control circuit component for driving light emission of the optical element based on an externally input electric signal; or
an optical element for receiving light emitted from a light emitting surface of the optical wiring and converting to an electric signal and a control circuit component for amplifying the electric signal output from the optical element and outputting to the outside; wherein
a plurality of boards overlapped and stacked so as to form a step with each other is arranged;
a first board stacked at one end in a stacking direction of the plurality of boards is mounted with the optical wiring and the optical element so as to sandwich both surfaces in the stacking direction, and a board surface on the first board side of a second board stacked at another end is mounted with the control circuit component;
the plurality of boards includes the first board, the second board, and a third board arranged between the first board and the second board; and
the third board is arranged to avoid the control circuit component.

2. The optical transmission module according to claim 1, wherein
the plurality of boards include the first board and the second board; and
the control circuit component is mounted on a board surface on which the first board is stacked in the second board.

3. The optical transmission module according to claim 2, wherein
a step portion including an end face in a light transmitting direction of the first board of the step portions formed by the plurality of boards is arranged with a light emission drive IC for driving the light emission of the optical element or an amplification IC for amplifying the electric signal output from the optical element of the plurality of control circuit components.

4. The optical transmission module according to claim 2, wherein
a recess recessed towards an inner side of the board is formed at one of four sides at a periphery of each board; and
the plurality of boards are stacked so that two surfaces of the recess facing each other of each board sandwich the optical element, the optical wiring, or the control circuit component.

5. The optical transmission module according to claim 1, wherein
a step portion including an end face in a light transmitting direction of the first board of the step portions formed by the plurality of boards is arranged with a light emission drive IC for driving the light emission of the optical element or an amplification IC for amplifying the electric signal output from the optical element of the plurality of control circuit components.

6. The optical transmission module according to claim 1, wherein
a recess recessed towards an inner side of the board is formed at one of four sides at a periphery of each board; and
the plurality of boards are stacked so that two surfaces of the recess facing each other of each board sandwich the optical element, the optical wiring, or the control circuit component.

7. The optical transmission module according to claim 1, wherein an electrical wiring is formed on both surfaces of the first board, and an inter-layer wiring for connecting the electrical wirings formed on both surfaces is formed on the first board.

8. The optical transmission module according to claim 1, wherein the first board and the optical wiring are integrated.

9. The optical transmission module according to claim 1, wherein the control circuit components are arranged side by side perpendicular to the light transmitting direction of the optical wiring on the board.

10. The optical transmission module according to claim 1, wherein
the optical wiring is formed with an optical path conversion mirror surface for converting an optical path of light transmitted to the end; and
a lid member is arranged to cover the optical path conversion mirror surface.

11. The optical transmission module according to claim 1, wherein
the control circuit component is arranged in plurals, and at least one board is arranged between the first board and the second board; and
a height in the stacking direction of a board arranged between the first board and the second board and the first board is the same as or less than a height of a maximum height control circuit component having the highest height in the stacking direction out of the plurality of control circuit components.

12. The optical transmission module according to claim 11, wherein
the maximum height control circuit component is mounted on the board surface of the second board; and
the first board is a protective board for protecting a surface on a side opposite to the second board in the maximum height control circuit component.

13. The optical transmission module according to claim 1, further comprising:
an external connector for electrically connecting with an external wiring; wherein
the external connector is formed with a connector recess recessed in the light transmitting direction; and
a first fit-in portion to be fitted to the connector recess is formed at an end in the light transmitting direction of the optical transmission module.

14. The optical transmission module according to claim 1, further comprising:
an external connector for electrically connecting with an external wiring; wherein
the external connector is formed with a vertical connector recess recessed perpendicular to the light transmitting direction; and
a second fit-in portion to be fitted to the vertical connector recess is formed at an end in the light transmitting direction of the optical transmission module.

15. An electronic device comprising the optical transmission module according to claim 1.

16. An electronic device comprising the optical transmission module according to claim 1, wherein
the plurality of boards include the first board and the second board;
the control circuit component is mounted on a board surface on which the first board is stacked in the second board;
a step portion including an end face in a light transmitting direction of the first board of the step portions formed by the plurality of boards is arranged with a light emission drive IC for driving the light emission of the optical element or an amplification IC for amplifying the electric signal output from the optical element of the plurality of control circuit components;
a recess recessed towards an inner side of the board is formed at one of four sides at a periphery of each board;
the plurality of boards are stacked so that two surfaces of the recess facing each other of each board sandwich the optical element, the optical wiring, or the control circuit component;
an opening passing through in the stacking direction is formed in the first board;
side surfaces forming the opening surround the control circuit component;
an electrical wiring is formed on both surfaces of the first board, and an inter-layer wiring for connecting the electrical wirings formed on both surfaces is formed on the first board;
the first board and the optical wiring are integrated;
the control circuit components are arranged side by side perpendicular to the light transmitting direction of the optical wiring on the board;
the optical wiring is formed with an optical path conversion mirror surface for converting an optical path of light transmitted to the end;
a lid member is arranged to cover the optical path conversion mirror surface;

the control circuit component is arranged in plurals, and at least one board is arranged between the first board and the second board;
a height in the stacking direction of a board arranged between the first board and the second board and the first board is the same as or less than a height of a maximum height control circuit component having the highest height in the stacking direction out of the plurality of control circuit components;
the maximum height control circuit component is mounted on the board surface of the second board;
the first board is a protective board for protecting a surface on a side opposite to the second board in the maximum height control circuit component;
the electronic device further comprises an external connector for electrically connecting with an external wiring;
the external connector is formed with a connector recess recessed in the light transmitting direction; and
a first fit-in portion to be fitted to the connector recess is formed at an end in the light transmitting direction of the optical transmission module.

17. An optical transmission module comprising:
an optical wiring for transmitting light; and
an optical element for irradiating a light incidence plane of the optical wiring with light and a control circuit component for driving light emission of the optical element based on an externally input electric signal; or
an optical element for receiving light emitted from a light emitting surface of the optical wiring and converting to an electric signal and a control circuit component for amplifying the electric signal output from the optical element and outputting to the outside; wherein
a plurality of boards overlapped and stacked so as to form a step with each other is arranged;
an opening passing through in the stacking direction is formed in the first board; and
side surfaces forming the opening surround the control circuit component.

18. A method for manufacturing an optical transmission module comprising:
an optical wiring for transmitting light; and
an optical element for irradiating a light incidence plane of the optical wiring with light and a control circuit component for driving light emission of the optical element based on an externally input electric signal; or
an optical element for receiving light emitted from a light emitting surface of the optical wiring and converting to an electric signal and a control circuit component for amplifying the electric signal output from the optical element and outputting to the outside;
wherein the method comprises:
overlapping and stacking a plurality of boards so as to faith a step with each other; and
mounting the optical wiring and the optical element on a first board stacked at one end in a stacking direction of the plurality of boards so as to sandwich both surfaces in the stacking direction, and mounting the plurality of control circuit components on a board surface on the first board side of a second board stacked at another end,
wherein the plurality of boards includes the first board, the second board, and a third board arranged between the first board and the second board; and
wherein the third board is arranged to avoid the control circuit component.

\* \* \* \* \*